(12) United States Patent
Chen et al.

(10) Patent No.: US 12,444,719 B2
(45) Date of Patent: Oct. 14, 2025

(54) PACKAGE AND MANUFACTURING METHOD THEREOF

(71) Applicant: Taiwan Semiconductor Manufacturing Company, Ltd., Hsinchu (TW)

(72) Inventors: Shing-Chao Chen, Hsinchu County (TW); Ching-Hua Hsieh, Hsinchu (TW); Chih-Wei Lin, Hsinchu County (TW); Sheng-Chieh Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/735,187

(22) Filed: Jun. 6, 2024

(65) Prior Publication Data

US 2024/0321848 A1    Sep. 26, 2024

Related U.S. Application Data

(63) Continuation of application No. 17/396,781, filed on Aug. 9, 2021, now Pat. No. 12,033,992, which is a continuation of application No. 16/103,925, filed on Aug. 14, 2018, now Pat. No. 11,088,124.

(51) Int. Cl.
| | |
|---|---|
| H01L 23/31 | (2006.01) |
| H01L 21/48 | (2006.01) |
| H01L 21/56 | (2006.01) |
| H01L 23/00 | (2006.01) |
| H01L 23/498 | (2006.01) |

(Continued)

(52) U.S. Cl.
CPC .......... *H01L 25/16* (2013.01); *H01L 21/4853* (2013.01); *H01L 21/4857* (2013.01); *H01L 21/568* (2013.01); *H01L 23/3128* (2013.01); *H01L 23/3135* (2013.01); *H01L 23/49822* (2013.01); *H01L 23/5381* (2013.01); *H01L 24/16* (2013.01); *H01L 2224/16225* (2013.01); *H01L 2224/17177* (2013.01)

(58) Field of Classification Search
CPC .............................. H01L 21/568; H01L 24/16
See application file for complete search history.

(56) References Cited

U.S. PATENT DOCUMENTS

2020/0006232 A1*   1/2020   Pietambaram ........ H01L 21/565

* cited by examiner

*Primary Examiner* — Ajay Ojha
*Assistant Examiner* — Hajar Kolahdouzan
(74) *Attorney, Agent, or Firm* — JCIPRNET

(57) ABSTRACT

A package includes a redistribution structure, a bridge die, conductive pillars, connectors, a first die, first solder joints, and second solder joints. The bridge die includes a substrate, a dielectric layer disposed on the substrate, and routing patterns embedded in the dielectric layer. The conductive pillars are coupled to the redistribution structure at a position that is laterally offset from the bridge die. The connectors are coupled to the bridge die and the redistribution structure, such that the bridge die is electrically coupled to the redistribution structure through at least the connectors. The first solder joints are coupled to the redistribution structure and the first die, such that the first die is electrically coupled to the bridge die. The second solder joints are coupled to the redistribution structure and the first die, such that the first die is electrically coupled to the conductive pillars.

20 Claims, 21 Drawing Sheets

(51) Int. Cl.
*H01L 23/538* (2006.01)
*H01L 25/16* (2023.01)

PACKAGE AND MANUFACTURING METHOD THEREOF

CROSS-REFERENCE TO RELATED APPLICATION

This application is a continuation application of and claims the priority benefit of U.S. application Ser. No. 17/396,781, filed on Aug. 9, 2021. The prior U.S. application Ser. No. 17/396,781 is a continuation application of and claims the priority benefit of a prior application Ser. No. 16/103,925, filed on Aug. 14, 2018. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1J are schematic cross-sectional views illustrating a manufacturing process of a package in accordance with some embodiments of the disclosure.

DETAILED DESCRIPTION

Figure 1A:
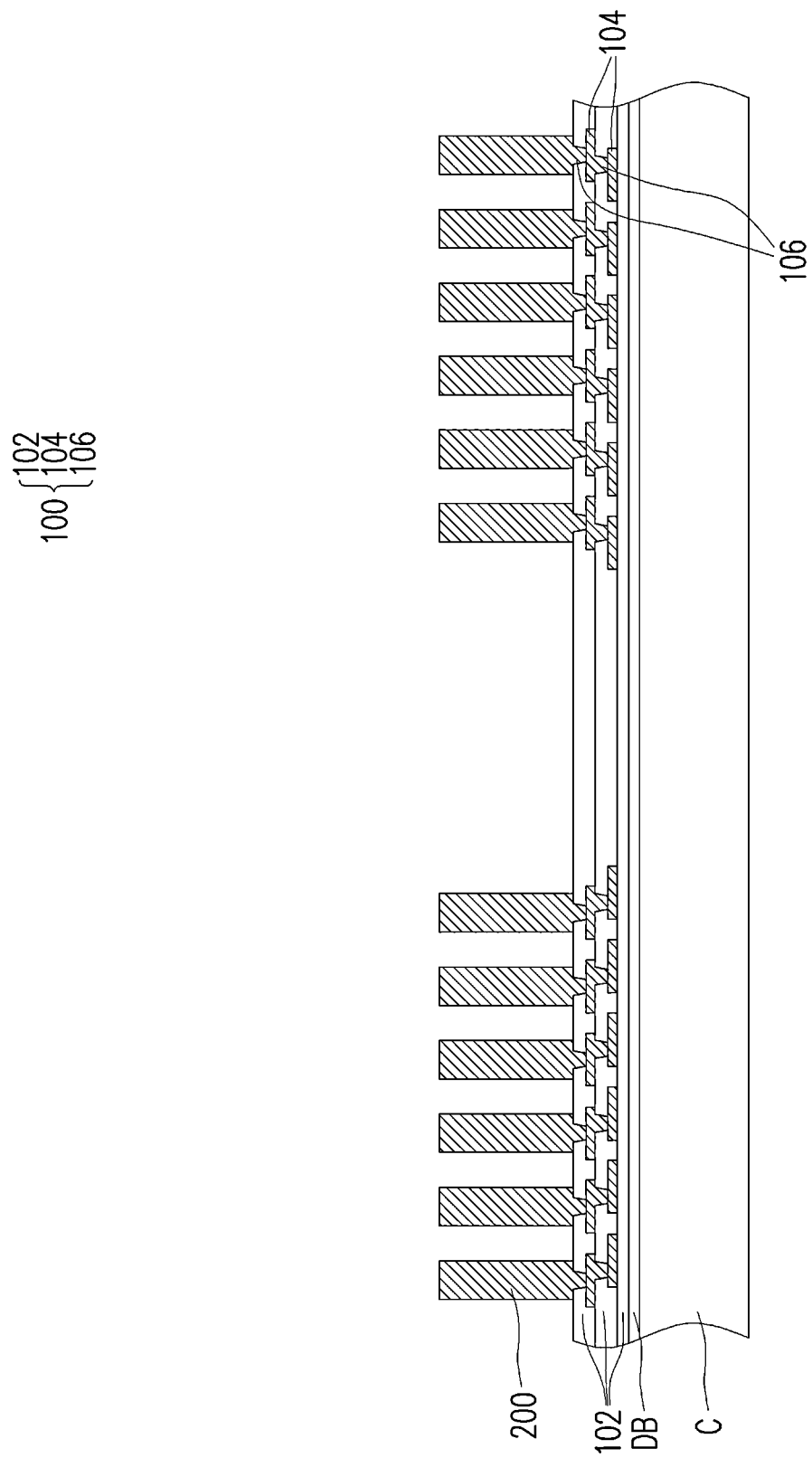

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a manufacturing process of a package 10 in accordance with some embodiments of the disclosure. Referring to FIG. 1A, a carrier C having a de-bonding layer DB formed thereon is provided. In some embodiments, the carrier C is a glass substrate. However, other suitable materials may be adapted as a material of the carrier C as long as the material is able to withstand the subsequent processes while carrying the package formed thereon. In some embodiments, the de-bonding layer DB is a light-to-heat conversion (LTHC) release layer formed on the glass substrate. The de-bonding layer DB may allow the structure formed on the carrier C in the subsequent processes to be peeled off from the carrier C.

As illustrated in FIG. 1A, a redistribution structure 100 and a plurality of conductive pillars 200 are formed over the de-bonding layer DB. In some embodiments, the redistribution structure 100 includes a plurality of dielectric layers 102 and a plurality of redistribution circuit patterns 104 stacked alternately. In some embodiments, the redistribution structure 100 further includes a plurality of conductive vias 106 embedded in the dielectric layers 102. In some embodiments, the redistribution circuit patterns 104 are interconnected with one another through the conductive vias 106.

The method of forming the redistribution structure 100 may include the following steps. First, the bottommost dielectric layer 102 may be formed on the de-bonding layer DB. In some embodiments, a material of the dielectric layer 102 includes polyimide, epoxy resin, acrylic resin, phenolic resin, benzocyclobutene (BCB), polybenzooxazole (PBO), or any other suitable polymer-based dielectric material. The dielectric layer 102, for example, may be formed by suitable fabrication techniques such as spin-on coating, chemical vapor deposition (CVD), plasma-enhanced chemical vapor deposition (PECVD), or the like. Thereafter, a seed material layer (not shown) is blanketly formed over the bottommost dielectric layer 102. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed redistribution circuit patterns 104. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the bottommost redistribution circuit patterns 104. After forming the bottommost dielectric layer 102 and the bottommost redistribution circuit patterns 104, another dielectric layer 102 may be formed over the bottommost dielectric layer 102 and the bottommost redistribution circuit patterns 104. Subsequently, a plurality of contact openings may be formed in such dielectric layer 102 to expose the bottommost redistribution circuit patterns 104. Then, the step of forming the seed material layer and the conductive material layer presented above may be repeated to render the redistribution circuit patterns 104 and the conductive vias 106 located above the bottommost redistribution circuit patterns 104. The foregoing steps may be repeated several times to obtain the redistribution structure 100 having multiple layers.

It should be noted that although two layers of the redistribution circuit patterns 104 and three layers of the dielectric layers 102 are illustrated in FIG. 1A, the number of these layers is not limited in the disclosure. In some alternative embodiments, the redistribution structure 100 may be constituted by more or less layers of the dielectric layer 102 and the redistribution circuit patterns 104 depending on the circuit design.

The conductive pillars 200 are formed over the redistribution structure 100. In some embodiments, the conductive pillars 200 are electrically connected to the redistribution structure 100. In some embodiments, the conductive pillars 200 may be formed simultaneously with the topmost conductive vias 106 during the same stage. For example, the topmost dielectric layer 102 of the redistribution structure 100 may be patterned to form a plurality of contact openings exposing at least a portion of the topmost redistribution circuit patterns 104. Subsequently, a seed material layer (not shown) is formed over the topmost dielectric layer 102 and over the topmost redistribution circuit pattern 104 exposed by the contact openings. In some embodiments, the seed material layer includes a titanium/copper composite layer and is formed by a sputtering process. Thereafter, a mask pattern (not shown) with openings is formed on the seed material layer. The openings of the mask pattern expose the intended locations for the subsequently formed conductive pillars 200. Afterwards, a plating process is performed to form a metal material layer (e.g., a copper layer) on the seed material layer exposed by the openings of the mask pattern. The mask pattern and the underlying seed material layer are then removed to form the conductive pillars 200 and the topmost conductive vias 106. However, the disclosure is not limited thereto. In some alternative embodiments, other suitable methods may be utilized to form the conductive pillars 200 and the topmost conductive vias 106. For example, pre-fabricated conductive pillars 200 may be picked and placed onto the redistribution structure 100 such that the conductive pillars 200 and the topmost conductive vias 106 are formed separately.

Figure 1B:
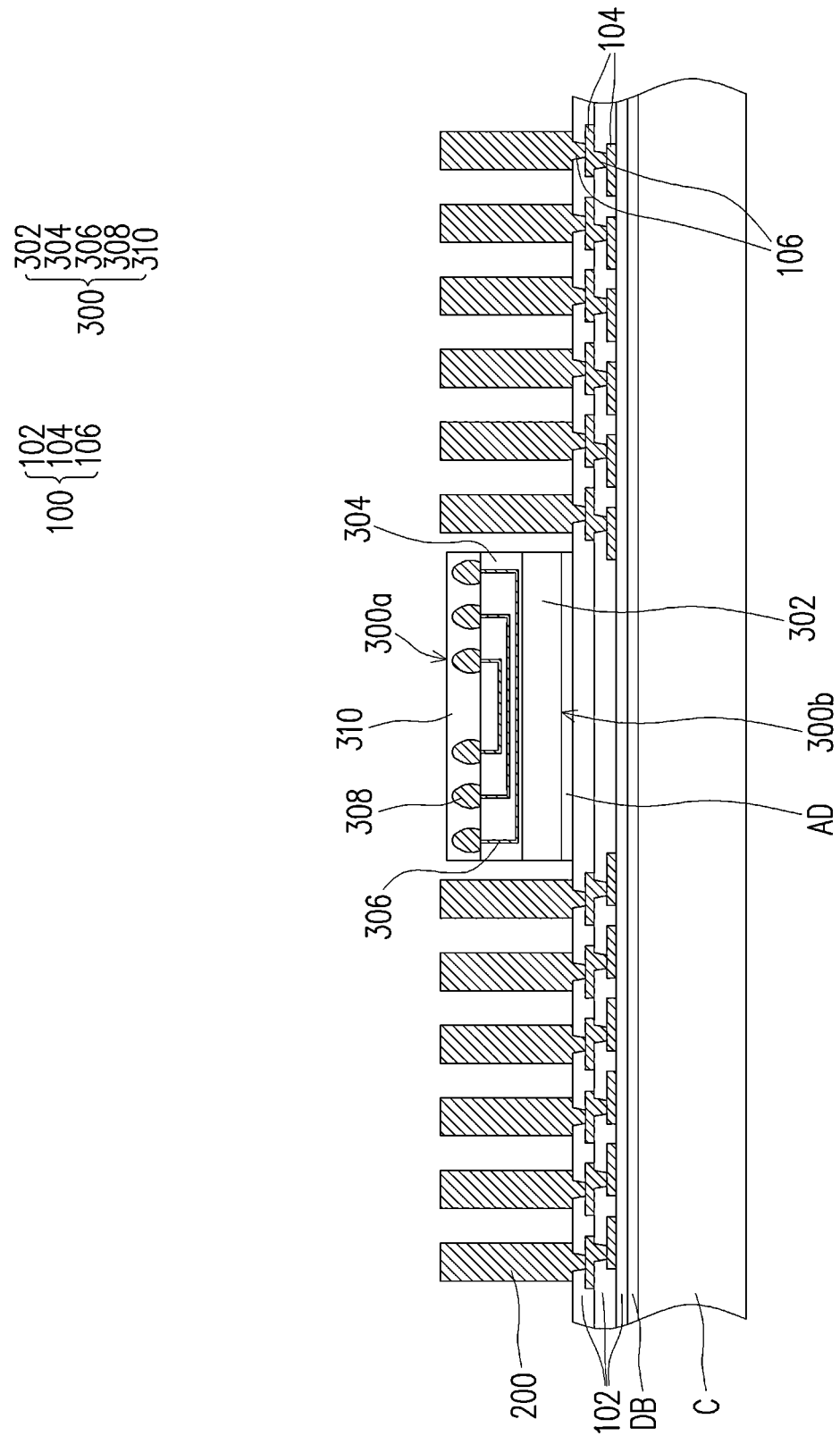

Referring to FIG. 1B, a bridge structure 300 is provided over the redistribution structure 100. In some embodiments, the bridge structure 300 is picked and placed onto the redistribution structure 100. For example, the bridge structure 300 may be placed such that the conductive pillars 200 surround the bridge structure 300. In other words, the bridge structure 300 and the conductive pillars 200 are located at a same level. In some embodiments, the bridge structure 300 includes a substrate 302, a dielectric layer 304 disposed on the substrate 302, a plurality of routing patterns 306 embedded in the dielectric layer 304, a plurality of connectors 308 disposed on routing patterns 306, and a passivation layer 310 covering the connectors 308.

In some embodiments, the substrate 302 may be a semiconductor substrate. For example, the substrate 302 may be made of silicon or other semiconductor materials. In some embodiments, the substrate 302 is made of a compound semiconductor such as silicon carbide, gallium arsenic, indium arsenide or indium phosphide. In some embodiments, the substrate 302 is made of an alloy semiconductor such as silicon germanium, silicon germanium carbide, gallium arsenic phosphide, or gallium indium phosphide. However, the disclosure is not limited thereto. In some alternative embodiments, the substrate 302 may be a glass substrate or a polymeric substrate. For example, the substrate 302 may include epoxy, polyimide, resin, or the like. In some embodiments, the substrate 302 may be a bulk substrate without any conductive feature embedded therein.

In some embodiments, a material of the dielectric layer 304 includes polyimide, epoxy resin, acrylic resin, phenolic resin, benzocyclobutene (BCB), polybenzoxazole (PBO), or any other suitable polymer-based dielectric material. The dielectric layer 304, for example, may be formed by suitable fabrication techniques such as spin-on coating, chemical vapor deposition (CVD), plasma-enhanced chemical vapor deposition (PECVD), or the like. The dielectric layer 304 may be a single layered or a multi-layered structure. In some embodiments, a material of the routing patterns 306 includes aluminum, titanium, copper, nickel, tungsten, and/or alloys thereof. In some embodiments, the routing patterns 306 may be formed by similar steps as that of the redistribution circuit patterns 104 in the redistribution structure 100, so the detailed description thereof is omitted herein. The connectors 308 are electrically connected to the routing patterns 306. In some embodiments, the connectors 308 may be made of conductive materials and may be plated on the routing patterns 306. For example, a material of the connectors 308 may include copper, copper alloys, or the like. However, the disclosure is not limited thereto. In some alternative embodiments, the connectors 308 may include other conductive materials such as gold, solder, silver, alloys thereof, or the like. In some embodiments, the connectors 308 may include conductive posts, conductive bumps, conductive pillars, conductive vias, or the like. For example, the connectors 308 may be micro-bumps. As illustrated in FIG. 1B, the connectors 308 are well protected by the passivation layer 310. In other words, the connectors 308 are not revealed. In some embodiments, the passivation layer 310 may be a silicon oxide layer, a silicon nitride layer, a silicon oxy-nitride layer, or a dielectric layer formed by other suitable dielectric materials. In some alternative embodiments, the passivation layer 310 may include polyimide, epoxy resin, acrylic resin, phenolic resin, BCB, PBO, or the like.

In some embodiments, the bridge structure 300 is free of active components (e.g. transistors or the like) and/or passive components (e.g., resistors, capacitors, inductors, or the like). For example, the bridge structure 300 may solely include trace layers for signal transmission without serving other functions. However, the disclosure is not limited thereto. In some alternative embodiments, the bridge structure 300 may include active components and/or passive components to perform functions other than signal transmission.

In some embodiments, the bridge structure 300 has a front surface 300a and a rear surface 300b opposite to the front surface 300a. As illustrated in FIG. 1B, the bridge structure 300 is placed such that the front surface 300a faces upward. On the other hand, the rear surface 300b of the bridge structure 300 is attached (or adhered) on the redistribution structure 100 through an adhesive layer AD. In other words, the adhesive layer AD is disposed between the bridge structure 300 and the first redistribution structure 100. In some embodiments, the adhesive layer AD may include a die attach film (DAF) or other materials having adhesion property. Although FIG. 1A and FIG. 1B illustrated that the conductive pillars 200 are formed prior to the placement of the bridge structure 300, the disclosure is not limited thereto. In some alternative embodiments, the bridge structure 300 may be placed before the conductive pillars 200 are formed on the redistribution structure 100.

Figure 1C:
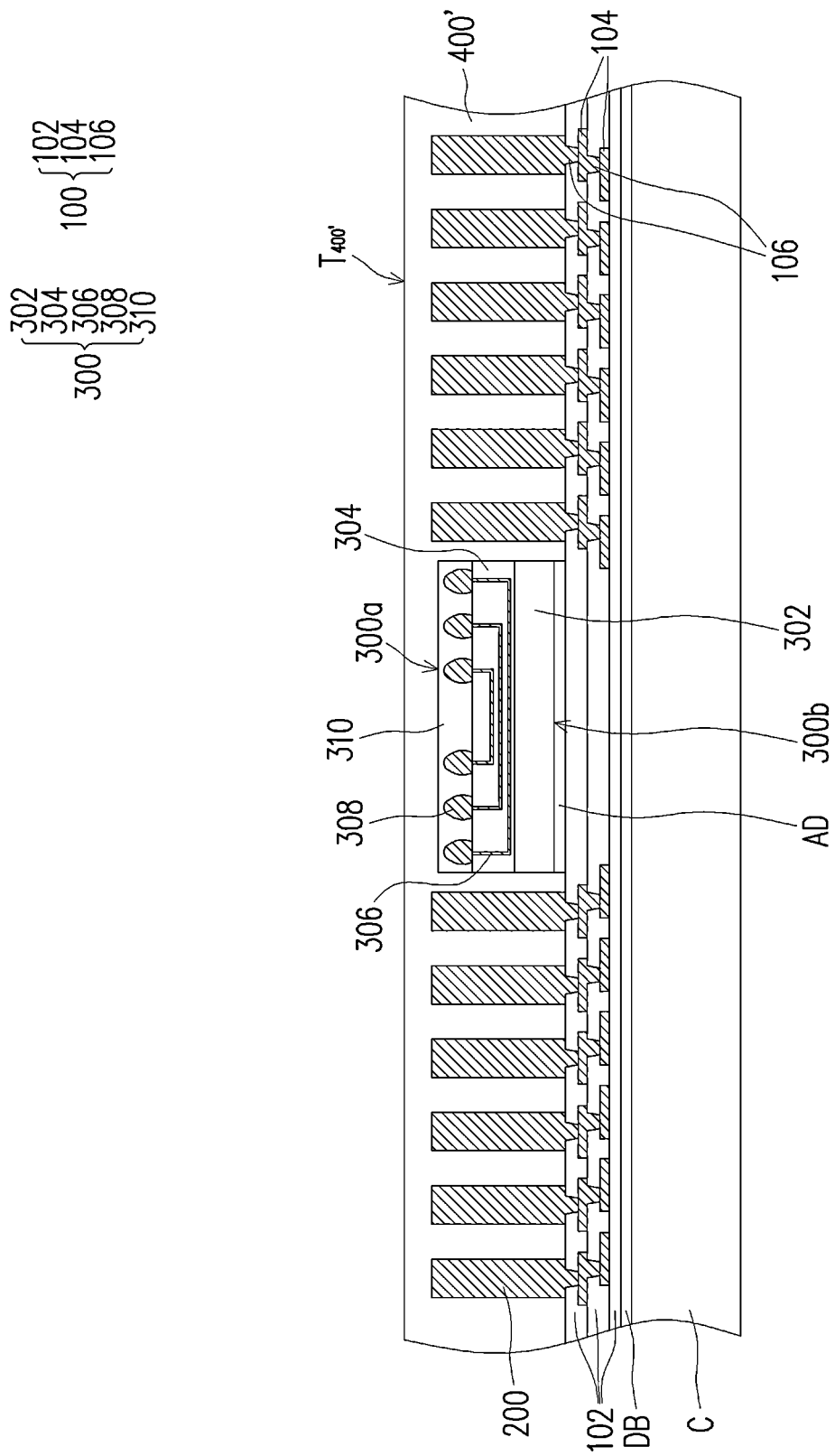

Referring to FIG. 1C, an encapsulation material 400' is formed over the redistribution structure 100 to cover the conductive pillars 200, the adhesive layer AD, and the bridge structure 300. For example, the conductive pillars 200, the adhesive layer AD, and the bridge structure 300 are encapsulated by the encapsulation material 400'. In some embodiments, a top surface $T_{400}$ of the encapsulation material 400' is located at a level height higher than the front surface 300a of the bridge structure 300 and top surfaces of the conductive pillars 200. In other words, the conductive pillars 200, the adhesive layer AD, and the bridge structure 300 are not revealed and are well protected by the encapsulation material 400'. In some embodiments, the encapsulation material 400' is a molding compound, a molding underfill, a resin (such as epoxy), or the like. In some embodiments, the encapsulation material 400' may include fillers. In some embodiments, the encapsulation material 400' may be formed by a molding process. For example, the encapsulation material 400' may be formed by a compression molding process.

Figure 1D:
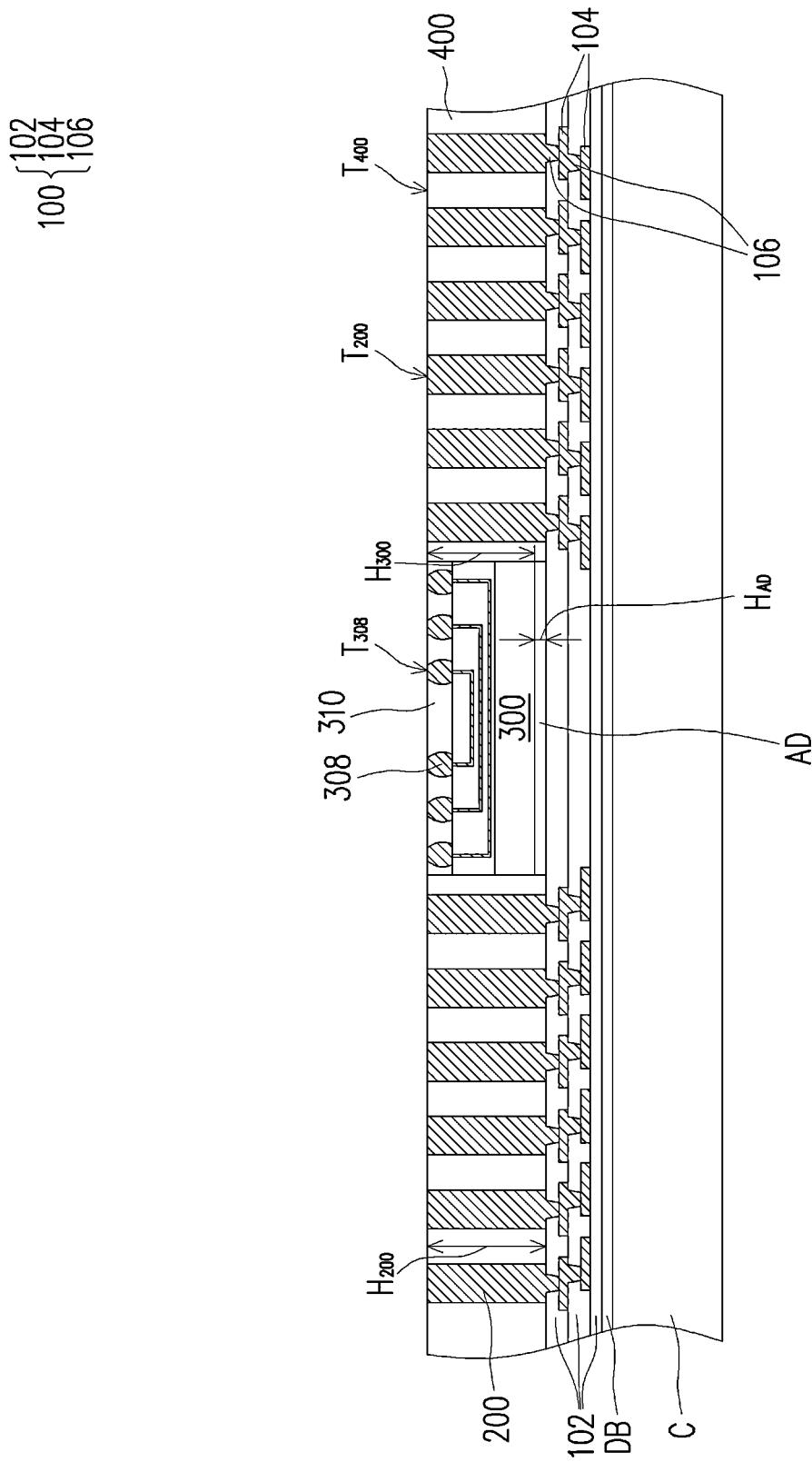

Referring to FIG. 1C and FIG. 1D, the encapsulation material 400' is planarized to form an encapsulant 400. In some embodiments, the front side 300a of the bridge structure 300 is also subjected to the planarization process. For example, the encapsulation material 400' is planarized until the conductive pillars 200 and the connectors 308 of the bridge structure 300 are exposed. In some embodiments, the planarization process includes a mechanical grinding process and/or a chemical mechanical polishing (CMP) process. However, the disclosure is not limited thereto. In some alternative embodiments, an etching process or a fly cutting process may be adapted to planarize the encapsulation material 400'. In some embodiments, during the planarization process, the encapsulation material 400' and the passivation layer 310 of the bridge structure 300 are both grinded until top surfaces $T_{200}$ of the conductive pillars 200 and top surfaces $T_{308}$ of the connectors 308 are both exposed. It should be noted that in some embodiments, portions of the conductive pillars 200 and portions of the connectors 308 are slightly grinded as well to ensure the conductive pillars 200 and the connectors 308 are both revealed. After the planarization process, the encapsulant 400 encapsulates sidewalls of the bridge structure 300 and sidewalls of the conductive pillars 200. In some embodiments, the encapsulant 400 is penetrated through by the conductive pillars 200. In other words, the conductive pillars 200 and the bridge structure 300 are embedded in the encapsulant 400. In some embodiments, the top surfaces $T_{200}$ of the conductive pillars 200 and the top surfaces $T_{308}$ of the connectors 308 are substantially coplanar with a top surface $T_{400}$ of the encapsulant 400.

In some embodiments, after the planarization process, a height $H_{200}$ of the conductive pillars 200 is substantially equal to a sum of a height $H_{AD}$ of the adhesive layer AD and a height $H_{300}$ of the bridge structure 300. For example, the sum of the height $H_{AD}$ of the adhesive layer AD and the height $H_{300}$ of the bridge structure 300 may range between about 50 µm and about 100 µm. Similarly, the height $H_{200}$ of the conductive pillars 200 may also range between about 50 µm and about 100 µm. In some embodiments, each conductive pillar 200 may have a diameter range between about 10 µm and about 20 µm. In other words, an aspect ratio of each conductive pillar 200 may range between about 1:5 and about 1:10.

Figure 1E:
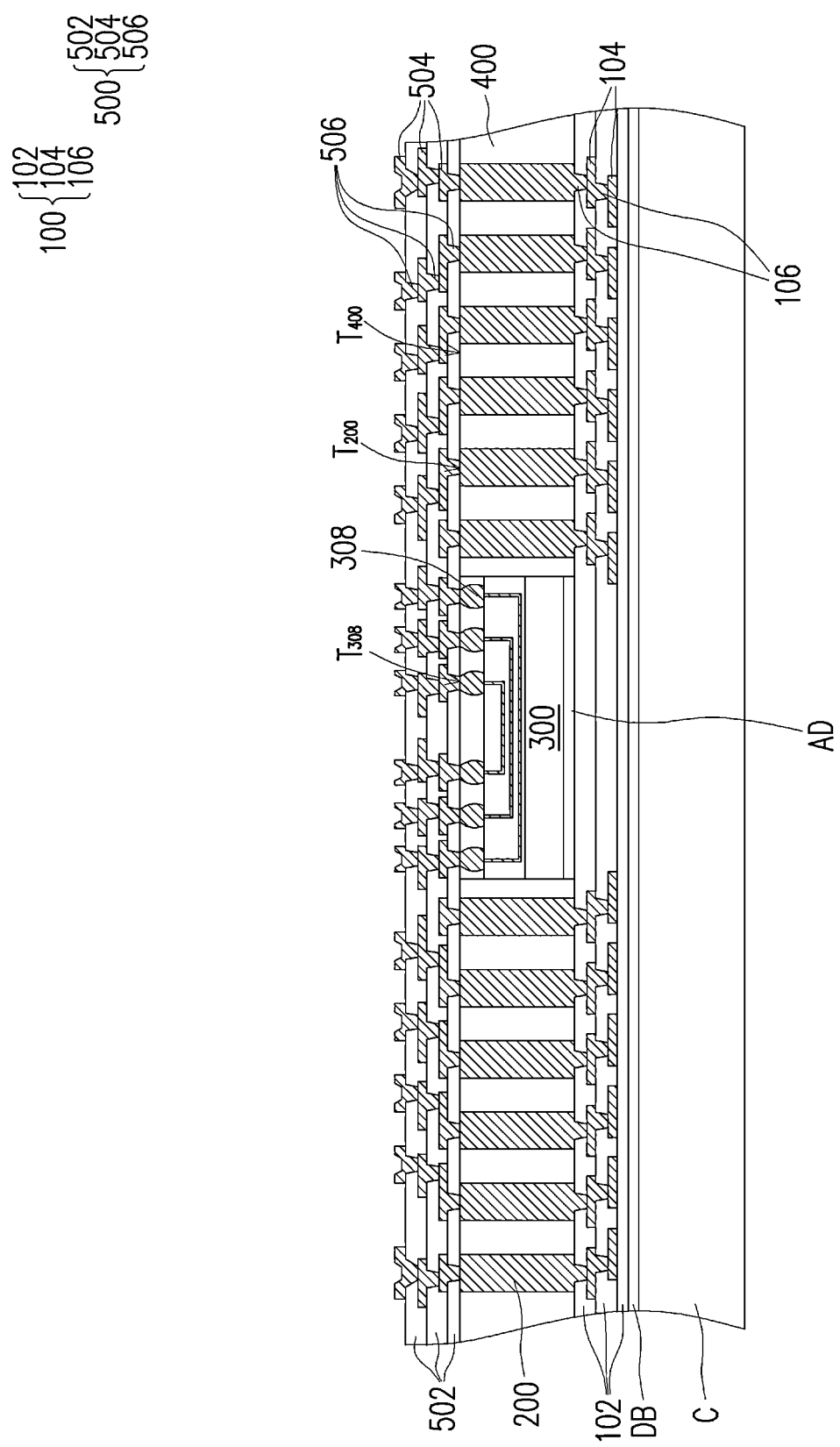

Referring to FIG. 1E, a redistribution structure 500 is formed on the conductive pillars 200, the bridge structure 300, and the encapsulant 400. In some embodiments, the redistribution structure 500 is formed over the top surfaces $T_{200}$ of the conductive pillars 200, the top surfaces $T_{308}$ of the connectors 308, and the top surface $T_{400}$ of the encapsulant 400. In some embodiments, the redistribution structure 500 is electrically connected to the connectors 308 of the bridge structure 300 and the conductive pillars 200. In some embodiments, the redistribution structure 500 includes a plurality of dielectric layers 502, a plurality of redistribution circuit patterns 504, and a plurality of conductive vias 506. In some embodiments, the dielectric layers 502 and the redistribution circuit patterns 504 are stacked alternately. On the other hand, the conductive vias 506 are embedded in the dielectric layer 502. In some embodiments, the redistribution circuit patterns 504 are interconnected with one another through the conductive vias 506.

In some embodiments, the top surfaces $T_{308}$ of the connectors 308 and the top surfaces $T_{200}$ of the conductive pillars 200 are in direct contact with the bottommost conductive vias 506 of the redistribution structure 500. In some embodiments, the top surfaces $T_{308}$ of the connectors 308 and the top surfaces $T_{200}$ of the conductive pillars 200 are partially covered by the bottommost dielectric layer 502. In some embodiments, the topmost redistribution circuit patterns 504 may be referred to as under-ball metallurgy (UBM) patterns for receiving other components subsequently formed thereon.

The method of forming the redistribution structure 500 may include the following steps. First, the bottommost dielectric layer 502 may be formed on the conductive pillars 200, the bridge structure 300, and the encapsulant 400. In some embodiments, a material of the dielectric layer 502 includes polyimide, epoxy resin, acrylic resin, phenolic resin, BCB, PBO, or any other suitable polymer-based dielectric material. The dielectric layer 502, for example, may be formed by suitable fabrication techniques such as spin-on coating, CVD, PECVD, or the like. Thereafter, a plurality of contact openings may be formed in the bottommost dielectric layer 502. The contact openings at least partially exposes each connector 308 of the bridge structure 300 and each conductive pillar 200. Then, a seed material layer (not shown) is formed over the bottommost dielectric layer 502 and in the contact openings. The seed material layer extends into the contact openings to be in contact with the connectors 308 and the conductive pillars 200. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed redistribution circuit patterns 504. For example, the openings of the mask pattern may expose the seed material layer located inside of the contact openings and the seed material layer in proximity of the contact openings. Afterwards, a plating process is performed to form a conductive material layer (not shown) on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the bottommost conductive vias 506 and the bottommost redistribution circuit patterns 504. In other words, the bottommost redistribution circuit patterns 504 and the bottommost conductive vias 506 may be formed by a same photolithography and etching process at the same time. The foregoing step may be repeated several times to obtain the redistribution structure 500 having multiple layers.

It should be noted that although three layers of the redistribution circuit patterns 504 and three layers of the dielectric layers 502 are illustrated in FIG. 1E, the number of these layers is not limited in the disclosure. In some alternative embodiments, the redistribution structure 500 may be constituted by more layers of the dielectric layer 502 and the redistribution circuit patterns 504 depending on the circuit design.

Figure 1F:
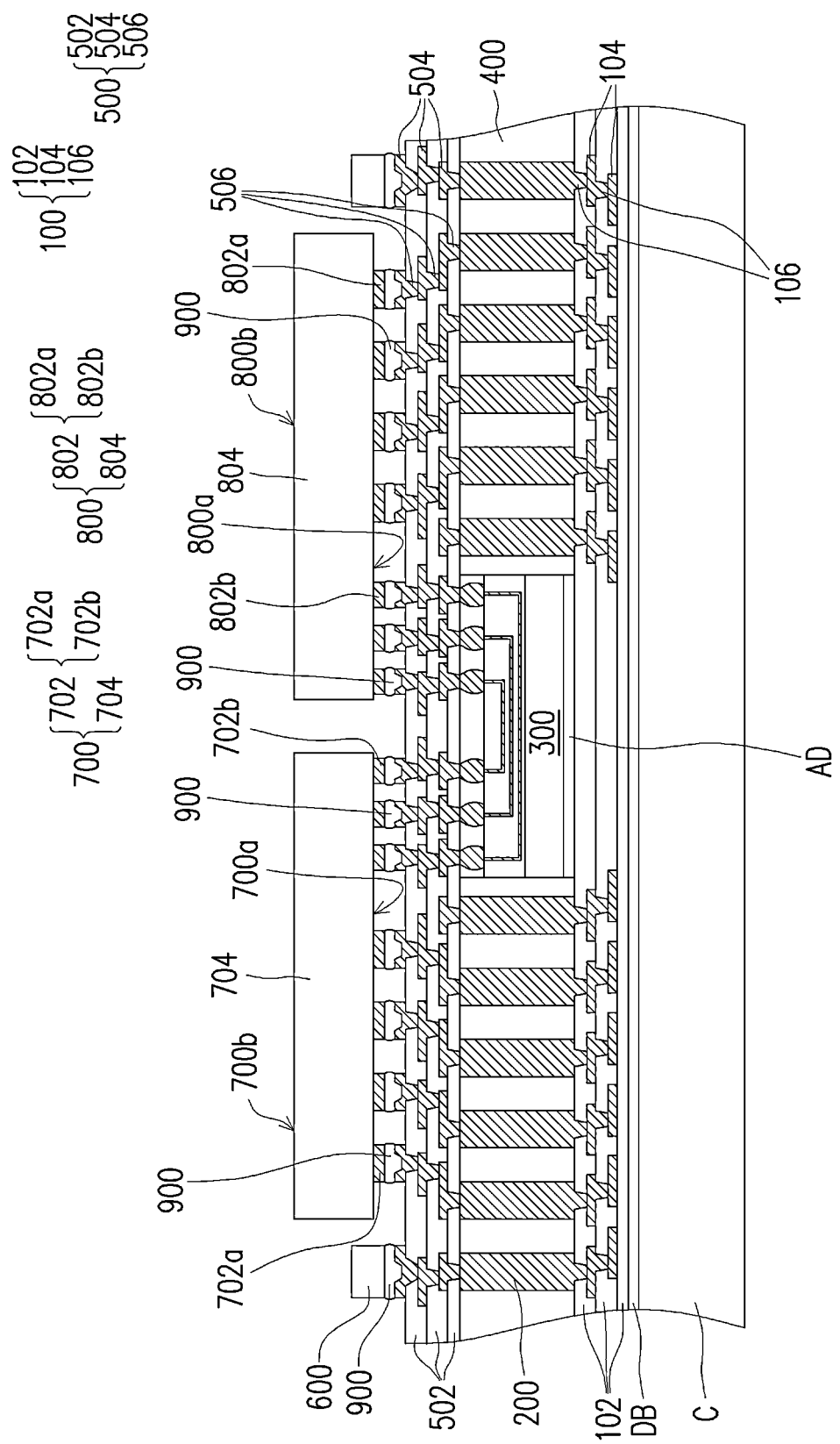

Referring to FIG. 1F, a first die 700 and a second die 800 are disposed on the redistribution structure 500. In some embodiments, the first die 700 and the second die 800 are disposed side by side over the redistribution structure 500. In some embodiments, the first die 700 and the second die 800 are disposed such that the redistribution structure 500 is located between the first die 700 and the bridge structure 300 and between the second die 800 and the bridge structure 300. In some embodiments, the first die 700 includes a substrate 704 and a plurality of conductive connectors 702. In some embodiments, the substrate 704 may be made of silicon or other semiconductor materials. For example, the substrate 704 may be a silicon bulk substrate. Alternatively, or additionally, the substrate 704 may include other elementary semiconductor materials such as germanium. In some embodiments, the substrate 704 is made of a compound semiconductor such as silicon carbide, gallium arsenic, indium arsenide or indium phosphide. In some embodiments, the substrate 704 is made of an alloy semiconductor such as silicon germanium, silicon germanium carbide, gallium arsenic phosphide, or gallium indium phosphide. Furthermore, the substrate 704 may be a semiconductor on insulator such as silicon on insulator (SOI) or silicon on sapphire. In some embodiments, the first die 700 may include active components (e.g., transistors or the like) and passive components (e.g., resistors, capacitors, inductors, or the like) formed therein.

In some embodiments, the conductive connectors 702 are disposed on the substrate 704. In some embodiments, a plurality of conductive pads (not shown) may be sandwiched between the conductive connectors 702 and the substrate 704. In some embodiments, a material of the conductive connectors 702 may include copper, copper alloys, or the like. However, the disclosure is not limited thereto. In some alternative embodiments, the conductive connectors 702 may include other conductive materials such as gold, solder, silver, alloys thereof, or the like. In some embodiments, the conductive connectors 702 may include conductive posts, conductive bumps, conductive pillars, conductive vias, or the like. For example, the conductive connectors 702 may be micro-bumps. As illustrated in FIG. 1F, the first die 700 has an active surface 700a and a rear surface 700b opposite to the active surface 700a. In some embodiments, the conductive connectors 702 are located on the active surface 700a of the first die 700. In some embodiments, the lateral surfaces of the conductive connectors 702 are exposed. In other words, the lateral surfaces of the conductive connectors 702 are not being encapsulated by a dielectric material.

In some embodiments, a diameter/width of each conductive connectors 702 ranges between about 15 µm and about 20 µm. On the other hand, a distance between two adjacent conductive connectors 702 ranges between about 15 µm and about 20 µm. In some embodiments, the conductive connectors 702 may be divided into a plurality of first sub-conductive connectors 702a and a plurality of second sub-conductive connectors 702b. As illustrated in FIG. 1F, a diameter/width of each second sub-conductive connectors 702b is smaller than a diameter/width of each first sub-conductive connectors 702a, and a gap between two adjacent second sub-conductive connectors 702b is smaller than a gap between two adjacent first sub-conductive connectors 702a. However, the configuration shown in FIG. 1F merely serves as an exemplary illustration and the disclosure is not limited thereto. In some alternative embodiments, all of the conductive connectors 702 may have the same dimension and size.

In some embodiments, the second die 800 includes a substrate 804 and a plurality of conductive connectors 802. In some embodiments, the second die 800 has an active surface 800a and a rear surface 800b opposite to the active surface 700a. In some embodiments, the conductive connectors 802 are located on the active surface 800a of the first die 800. The substrate 804 and the conductive connectors 802 of the second die 800 may be similar to the substrate 704 and the conductive connectors 702 of the first die 700, so the detailed descriptions thereof are omitted herein. In some embodiments, the conductive connectors 802 may be divided into a plurality of first sub-conductive connectors 802a and a plurality of second sub-conductive connectors 802b. As illustrated in FIG. 1F, a diameter/width of each second sub-conductive connectors 802b is smaller than a diameter/width of each first sub-conductive connectors 802a, and a gap between two adjacent second sub-conductive connectors 802b is smaller than a gap between two adjacent first sub-conductive connectors 802a. However, the configuration shown in FIG. 1F merely serves as an exemplary illustration and the disclosure is not limited thereto. In some alternative embodiments, all of the conductive connectors 802 may have the same dimension and size.

The first die 700 and the second die 800 are electrically connected to the redistribution structure 500. In some embodiments, the first die 700 and the second die 800 are disposed on the redistribution structure 500 through flip-chip bonding. For example, the conductive connectors 702 of the first die 700 and the conductive connectors 802 of the second die 800 are respectively connected to the topmost redistribution circuit patterns (UBM patterns) 504 through a plurality of solder joints 900. In some embodiments, a solder paste (not shown) may be formed on the conductive connectors 702 and the conductive connectors 802. Subsequently, the conductive connectors 702 and the conductive connectors 802 having the solder paste formed thereon is attached to the topmost redistribution circuit patterns 504 of the redistribution structure 500. Thereafter, a reflow process is performed to ensure the adhesion between the first die 700, the second die 800, and the redistribution structure 500, thereby forming the solder joints 900 between the conductive connectors 702 and the topmost redistribution circuit patterns 504 and between the connectors 802 and the topmost redistribution circuit patterns 504. As illustrated in FIG. 1F, the locations of the second sub-conductive connectors 702b, 802b correspond to the location of the connectors 308 of the bridge structure 300. However, this configuration merely serves as an exemplary illustration. In some alternative embodiments, the locations of the second sub-conductive connectors 702b, 802b may not correspond to the location of the connectors 308 of the bridge structure 300.

In some embodiments, the first die 700 is electrically connected to the second die 800 through the bridge structure 300. For example, the signal generated from the device formed in the substrate 704 of the first die 700 may be transmitted to the device formed in the substrate 804 of the second die 800 through the conductive connectors 702, the solder joints 900, the redistribution circuit patterns 504 of the redistribution structure 500, the connectors 308 and the routing patterns 306 of the bridge structure 300, and the conductive connectors 802. In some embodiments, the bridge structure 300 functions as an interconnecting structure for the first die 700 and the second die 800 and provides an effective connection path between the first die 700 and the second die 800. As such, high density layout and die-to-die interconnection within the package may be realized through the bridge structure 300 without adapting other additional substrate, thereby reducing the overall size of the subsequently formed package 10 while saving the manufacturing cost. In some embodiments, the first die 700 and the second die 800 are electrically connected to the redistribution structure 100. For example, the first die 700 and the second die 800 may be electrically connected to the redistribution structure 100 sequentially through the redistribution structure 500 and the conductive pillars 200.

As illustrated in FIG. 1F, a plurality of passive components 600 are also disposed on the redistribution structure 500. In some embodiments, the passive components 600 are disposed adjacent to the first die 700 and/or the second die 800. In some embodiments, the passive components 600 may include resistors, capacitors, inductors, or the like. Similar to the first die 700 and the second die 800, the passive components 600 are electrically connected to the topmost redistribution circuit patterns 504 of the redistribution structure 500 through the solder joints 900 disposed therebetween.

Figure 1G:
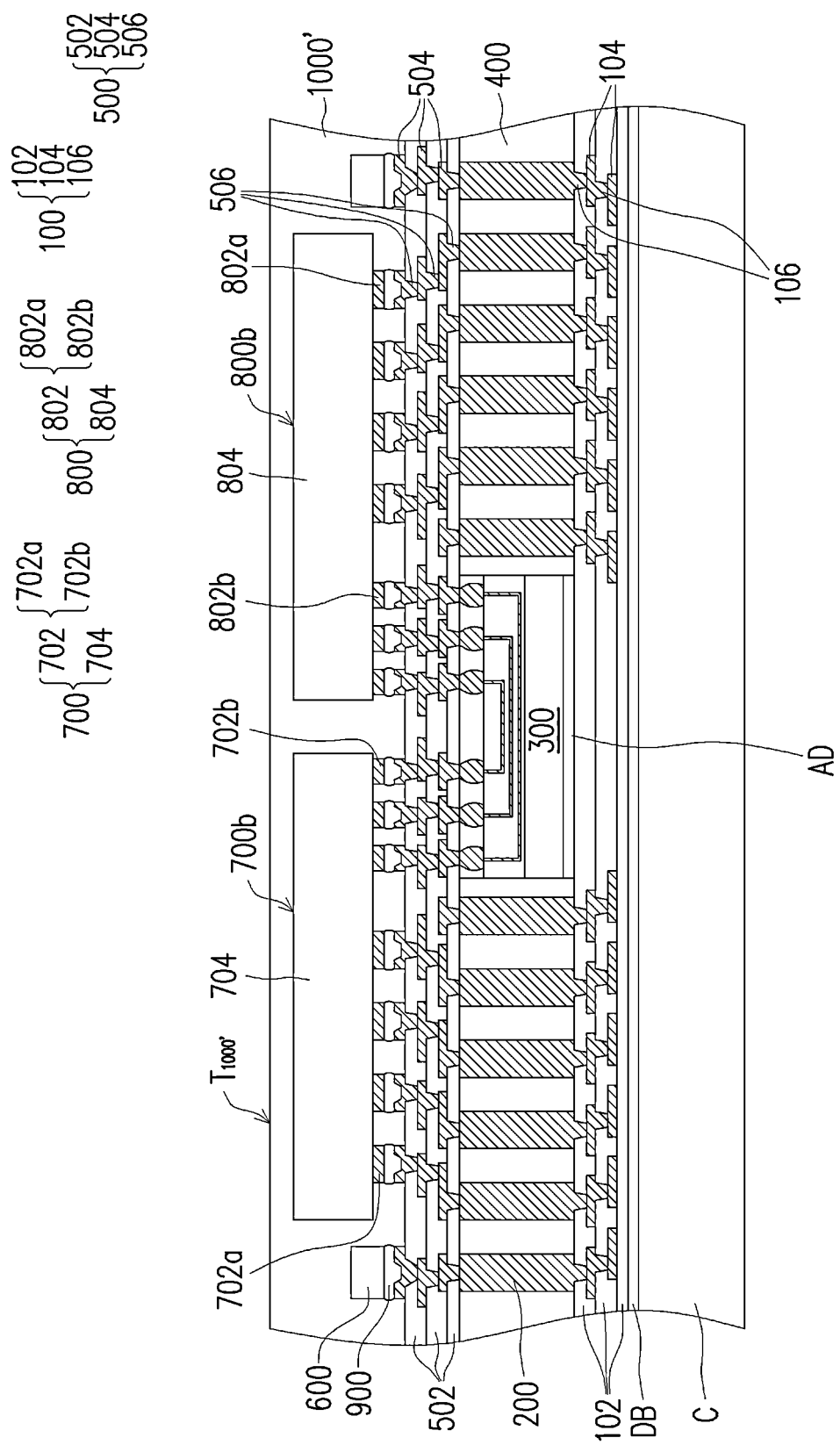

Referring to FIG. 1G, an encapsulation material 1000' is formed over the redistribution structure 500 to cover the passive components 600, the first die 700, and the second die 800. In some embodiments, a top surface $T_{1000'}$ of the encapsulation material 1000' is located at a level height higher than the rear surface 700b of the first die 700, the rear surface 800b of the second die 800, and top surfaces of the passive components 600. In other words, the passive components 600, the first die 700, and the second die 800 are not revealed and are well protected by the encapsulation material 1000'. The encapsulation material 1000' may include materials identical to or different from the materials included in the encapsulation material 400' in FIG. 1C. For example, the encapsulation material 1000' may be a molding compound, a molding underfill, a resin (such as epoxy), or the like. In some embodiments, the encapsulation material 1000' may include fillers. In some embodiments, the encapsulation material 1000' may be formed by a molding process. For example, the encapsulation material 1000' may be formed by an over-molding process. In some embodiments, the encapsulation material 1000' fills spacings between two adjacent conductive connectors 702 and spacings between two adjacent conductive connectors 802. In other words, the conductive connectors 702, 802 and the solder joints 900 are directly in contact with the encapsulation material 1000'.

Figure 1H:
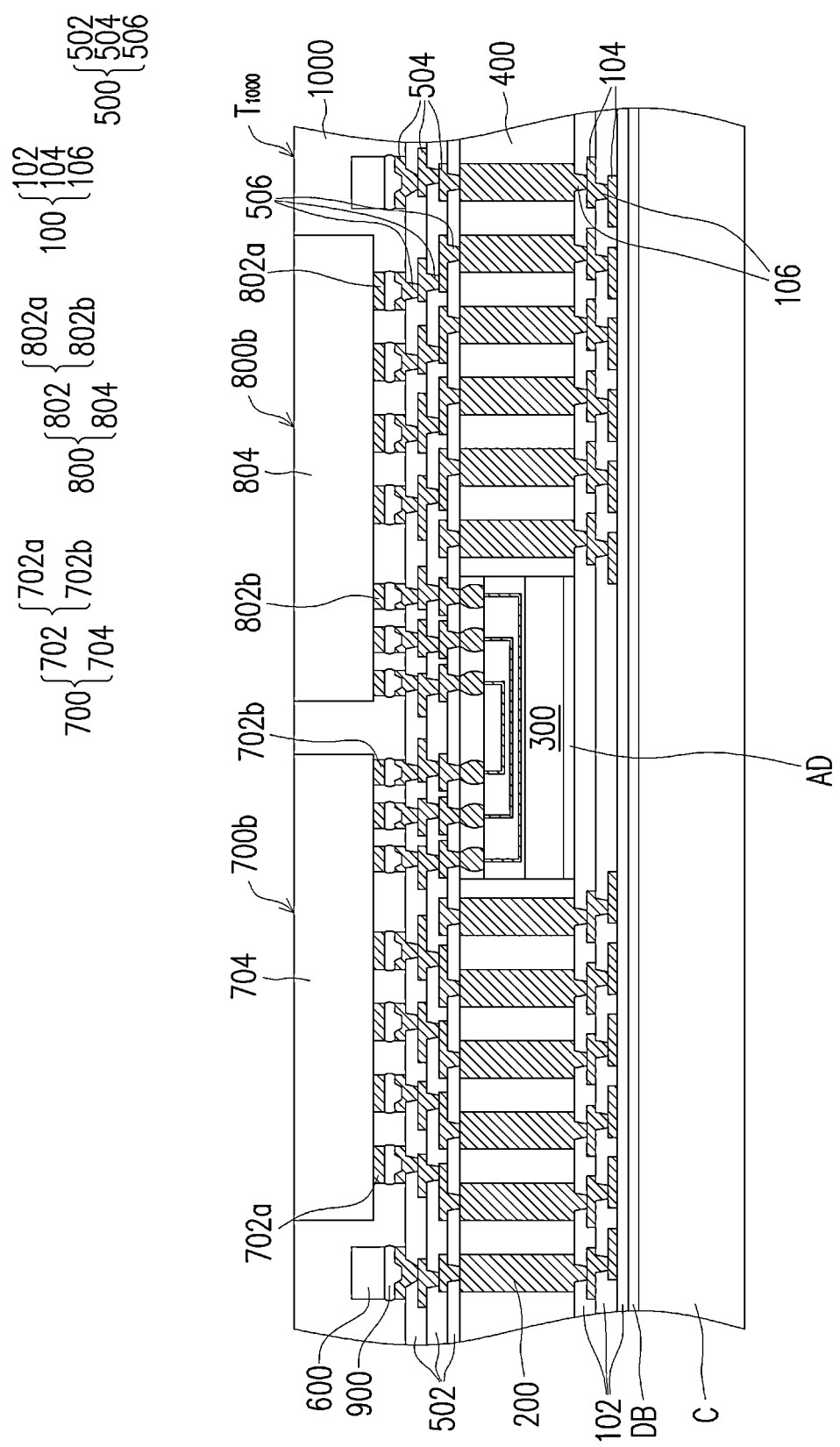
Figure 11:
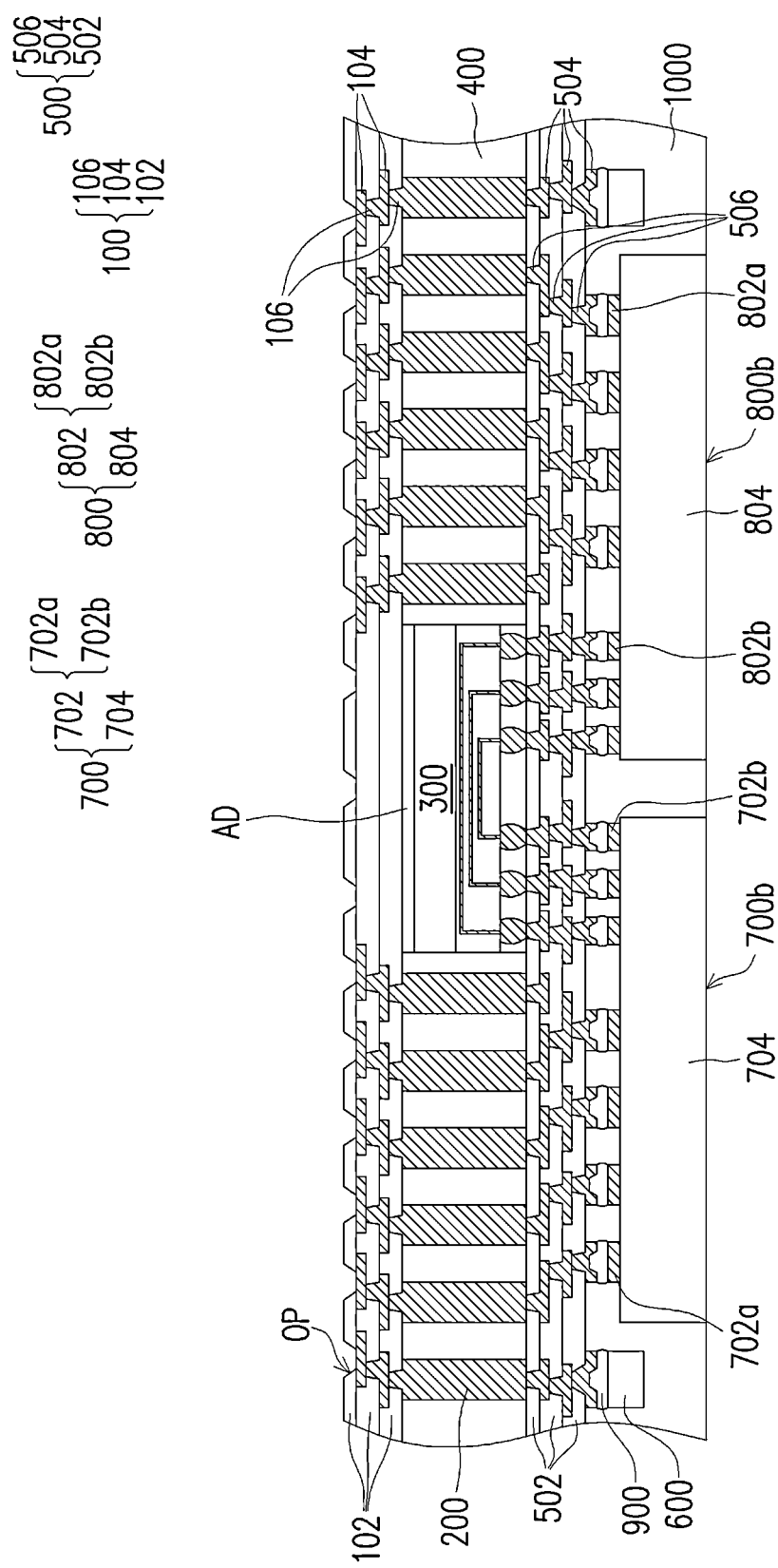

Referring to FIG. 1G and FIG. 1H, the encapsulation material 1000' is planarized to form an auxiliary encapsulant 1000. In some embodiments, a thickness of the encapsulation material 1000' is reduced to expose the rear surface 700b of the first die 700 and the rear surface 800b of the second die 800. In some embodiments, the planarization process includes a mechanical grinding process and/or a chemical mechanical polishing (CMP) process. However, the disclosure is not limited thereto. In some alternative embodiments, an etching process or a fly cutting process may be adapted to planarize the encapsulation material 1000'. It should be noted that in some embodiments, portions of the substrate 704 and portions of the substrate 804 are slightly grinded as well to reduce the overall thickness of the subsequently formed package structure. In other words, the rear surface 700b of the first die 700 and the rear surface 800b of the second die 800 are also grinded. After the planarization process, the auxiliary encapsulant 1000 encapsulates sidewalls of the first die 700 and sidewalls of the second die 800. In some embodiments, the rear surface 700b of the first die 700 and the rear surface 800b of the second die 800 are substantially coplanar with a top surface $T_{1000}$ of the auxiliary encapsulant 1000. As mentioned above, the encapsulation material 1000' fills the spacings between two adjacent conductive connectors 702 and the spacings between two adjacent conductive connectors 802. Therefore, the conductive connectors 702, 802 are directly in contact with the auxiliary encapsulant 1000 and are well protected by the auxiliary encapsulant 1000. The reliability and the durability of the conductive connectors 702, 802 may be ensured through the usage of the auxiliary encapsulant 1000 without adapting additional underfill.

It should be noted that the steps of forming the auxiliary encapsulant 1000 presented in FIG. 1G and FIG. 1H merely serve as exemplary illustrations, and the disclosure is not limited thereto. In some alternative embodiments, the auxiliary encapsulant 1000 may be formed by other suitable methods. For example, an alternative process of forming the auxiliary encapsulant 1000 will be discussed below in conjunction with FIG. 2A to FIG. 2C.

Figure 2A:
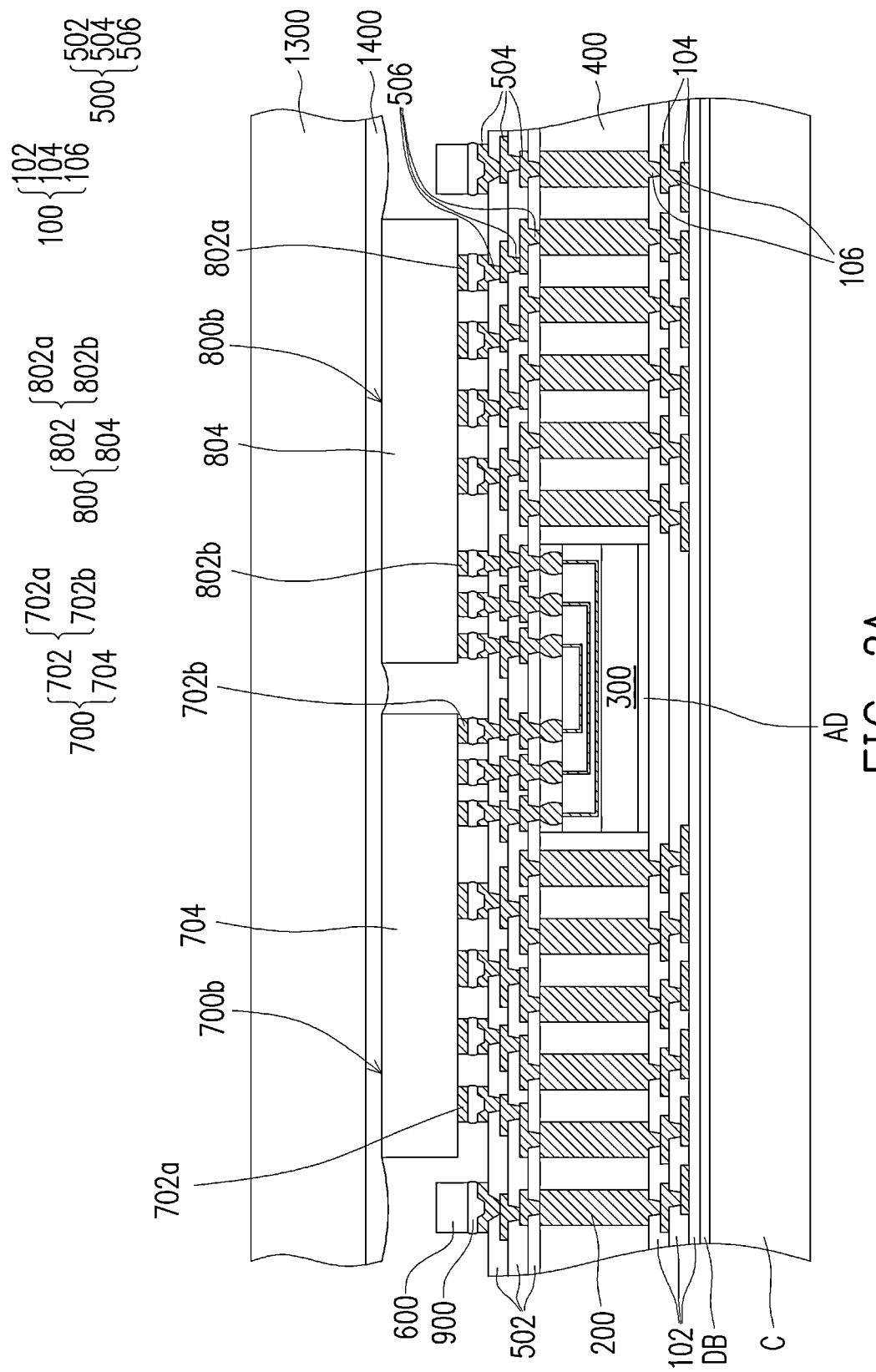
FIG. 2A to FIG. 2C are schematic cross-sectional views illustrating various intermediate stages of a manufacturing process of a package in accordance with some alternative embodiments of the disclosure.
Figure 2B:
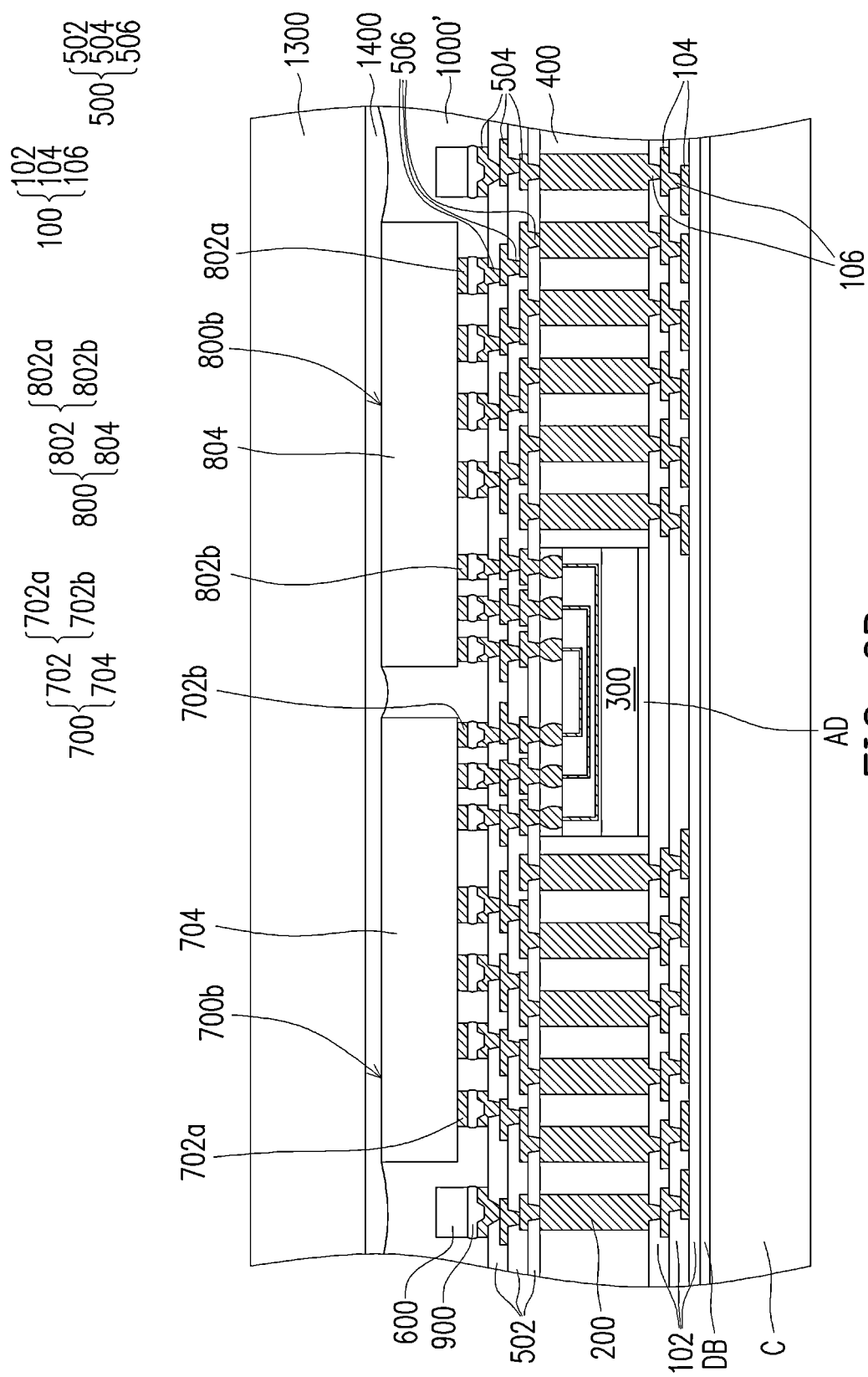
Figure 2C:
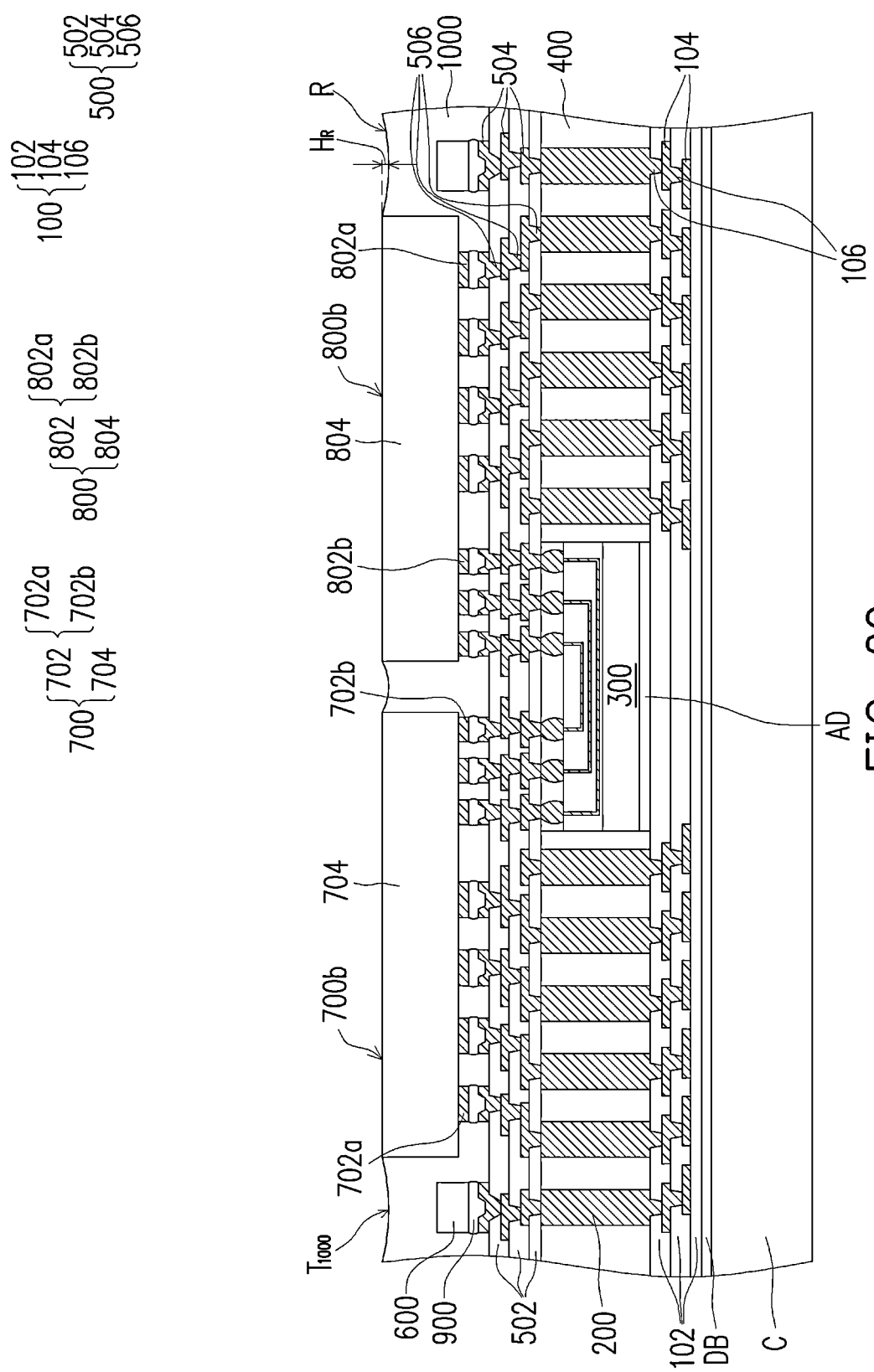

FIG. 2A to FIG. 2C are schematic cross-sectional views illustrating various intermediate stages of a manufacturing process of a package 10 in accordance with some alternative embodiments of the disclosure. Referring to FIG. 2A, a mold chase 1300 having a release film 1400 attached thereon is provided over the first die 700 and the second 800. In some embodiments, the mold chase 1300 and the release film 1400 are being pressed firmly against the first die 700 and the second die 800. For example, the mold chase 1300 and the release film 1400 may be pressed such that the release film 1400 is attached to/directly in contact with the rear surface 700b of the first die 700 and the rear surface 800b of the second die 800. Due to lack of support, a portion of the release film 1400 above the spacings between the first die 700 and the second die 800 may have a wavy profile extending slightly below the rear surface 700b of the first die 700 and the rear surface 800b of the second die 800.

Referring to FIG. 2B, the encapsulation material 1000' is filled into a gap between the release film 1400 and the second redistribution structure 500 to encapsulate the passive components 600, the first die 700, and the second die 800. The detailed description of the encapsulation material 1000' may be found in the text related to FIG. 1G and will not be repeated herein.

Referring to FIG. 2B and FIG. 2C, after the encapsulation material 1000' fills the gap between the release film 1400 and the second redistribution structure 500, the encapsulation material 1000' is cured to form the auxiliary encapsulant 1000. Subsequently, the release film 1400 and the mold chase 1300 are removed. As illustrated in FIG. 2B and FIG. 2C, a profile of the auxiliary encapsulant 1000 is conformal with the profile of the wavy portion of the release film 1400. In other words, a plurality of recesses R may be observed at the top surface $T_{1000}$ of the auxiliary encapsulant 1000. In some embodiments, a maximum depth HR of the recess may be less than about 7 μm. In some embodiments, the process illustrated in FIG. 2A to FIG. 2C may be referred to as an exposure mode molding process. When using the exposure mode molding process, the grinding back step may be eliminated.

Referring back to FIG. 1I, after the auxiliary encapsulant 1000 is formed, the structure illustrated in FIG. 1H or FIG. 1C is flipped upside down. The de-bonding layer DB and the carrier C are removed from the redistribution structure 100. In some embodiments, the de-bonding layer DB (e.g., the LTHC release layer) may be irradiated by an UV laser such that the carrier C and the de-bonding layer DB may be peeled off from the dielectric layer 102 of the redistribution structure 100. However, the de-bonding process is not limited thereto. Other suitable de-carrier methods may be used in some alternative embodiments. After the de-bonding layer DB and the carrier C are removed, a plurality of openings OP are formed in the outermost dielectric layer 102 of the redistribution structure 100. In some embodiments, the openings OP are formed by a laser drilling process, a mechanical drilling process, a photolithography process and an etching process, or other suitable processes. As illustrated in FIG. 1I, the openings OP expose the outermost redistribution circuit patterns 104 of the redistribution structure 100.

Figure 1J:
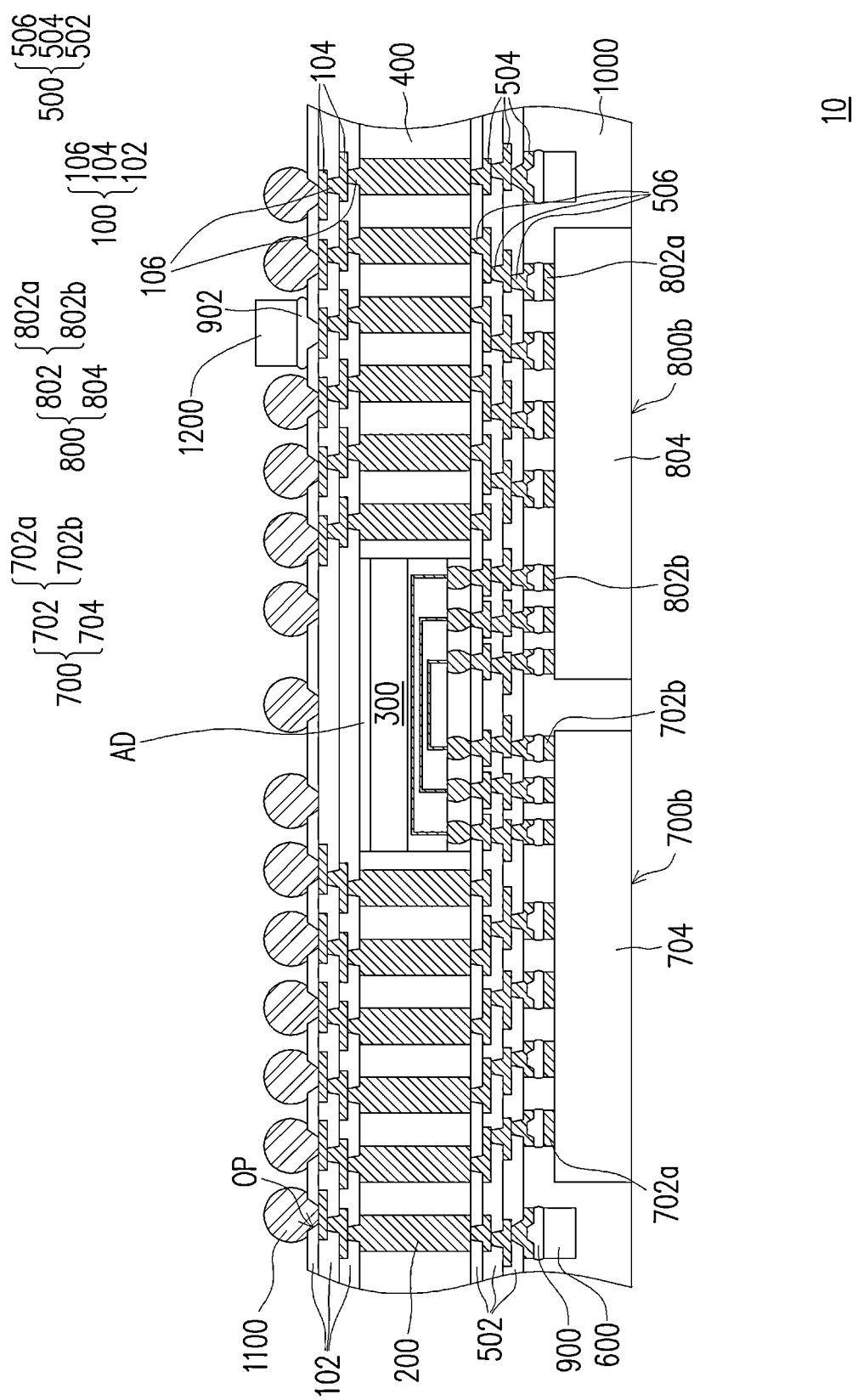

Referring to FIG. 1J, a plurality of conductive terminals 1100 and at least one passive device 1200 are formed on the redistribution structure 100 opposite to the bridge structure 300. In some embodiments, the conductive terminals 1100 extend into the openings OP to electrically connect with the outermost redistribution circuit patterns 104. In some embodiments, a plurality of under bump metallization (UBM) patterns (not shown) may be formed on the outermost dielectric layer 102 and in the openings OP. The conductive terminals 1100 may be disposed over the UBM patterns. In some embodiments, the conductive terminals 1100 are attached to the UBM patterns through a solder flux. In some embodiments, the conductive terminals 1100 are, for example, solder balls. In some embodiments, the conductive terminals 1100 may be disposed on the redistribution structure 100 through a ball placement process and/or a reflow process. In some embodiments, the passive device 1200 may include resistors, capacitors, inductors, or the like. In some embodiments, the passive device 1200 are electrically connected to the outermost redistribution circuit patterns 104 of the redistribution structure 100 through a plurality of solder joints 902 disposed therebetween. The solder joints 902 may be similar to the solder joints 900 in FIG. 1F, so the detailed description thereof is omitted herein.

After forming the conductive terminals 1100 and the passive device 1200 on the redistribution structure 100, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the package 10 may be referred to as an integrated fan-out (InFO) package. However, the disclosure is not limited thereto. In some alternative embodiments, the package 10 may be other types of packages. As mentioned above, through the usage of the bridge structure 300, additional substrate adapted conventionally may be omitted. Since no additional substrate is being utilized, the warpage of the package during the manufacturing process thereof may be sufficiently controlled through the selection of the encapsulation materials 400', 1000'. As such, the conventionally adapted mechanical strength enhancer such as lids or rings may be eliminated, and the size of the package 10 may be further reduced.

Figure 3A:
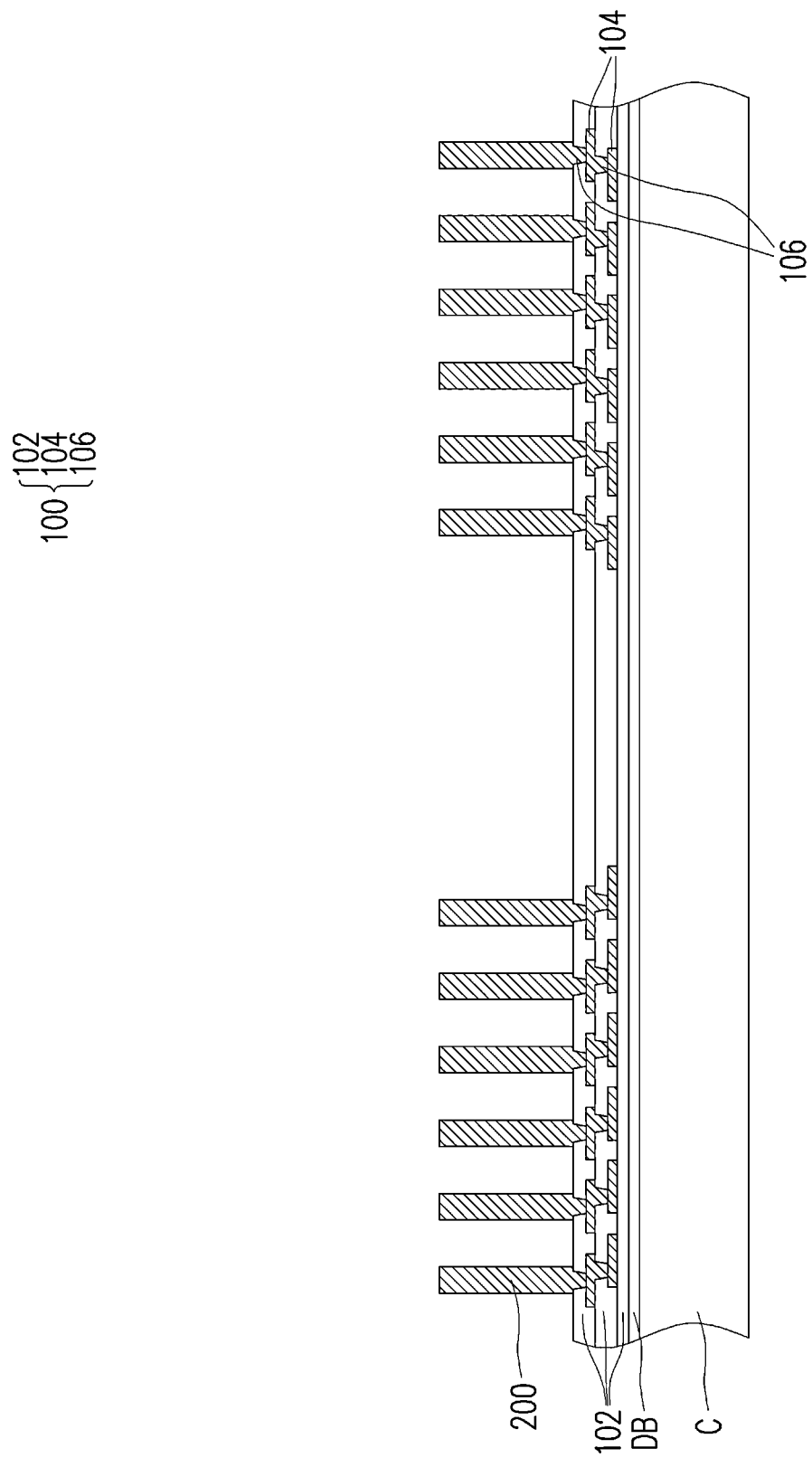
FIG. 3A to FIG. 3H are schematic cross-sectional views illustrating a manufacturing process of a package in accordance with some alternative embodiments of the disclosure.
Figure 3B:
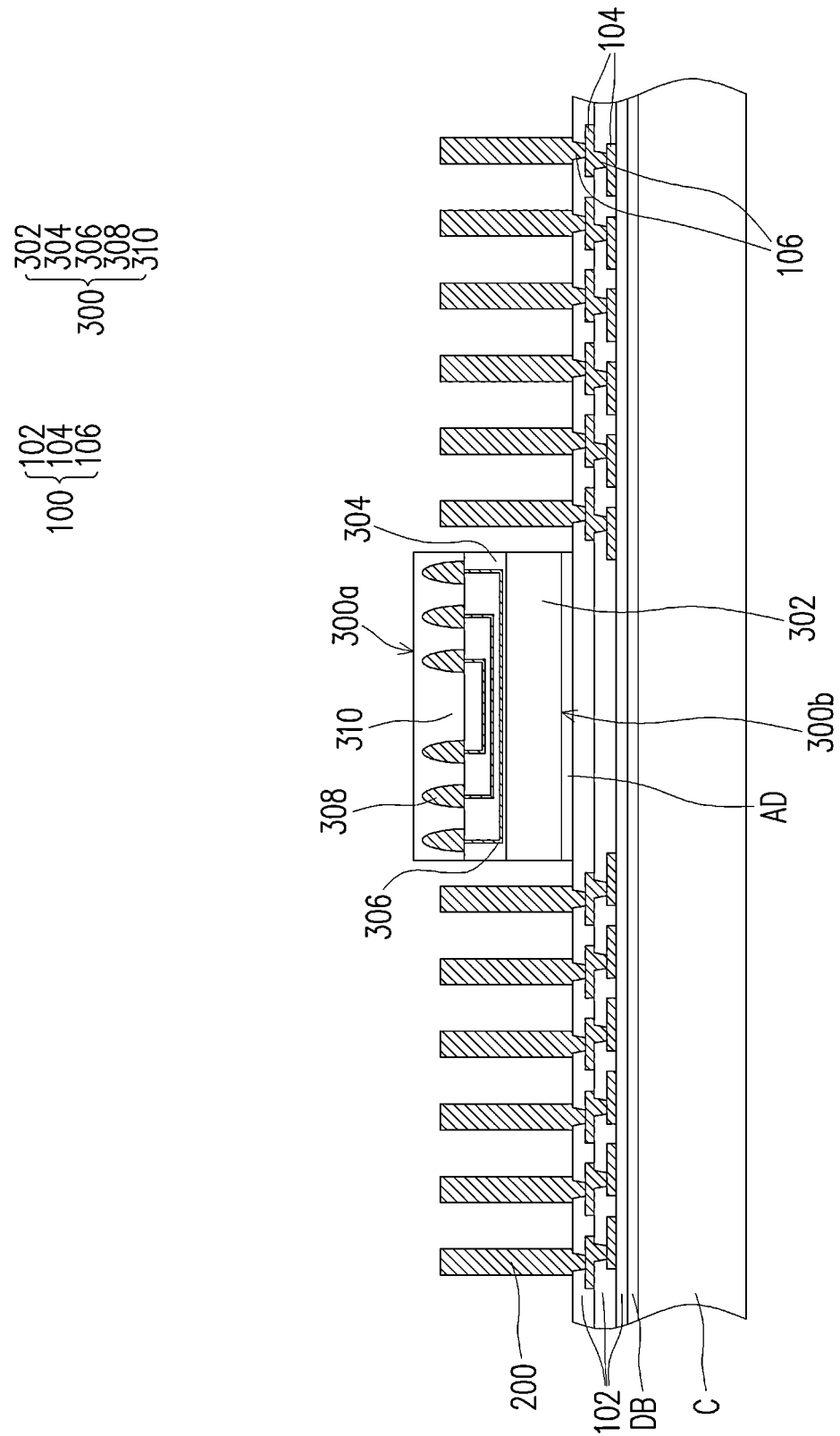

FIG. 3A to FIG. 3H are schematic cross-sectional views illustrating a manufacturing process of a package 20 in accordance with some alternative embodiments of the disclosure. The elements presented in FIG. 3A to FIG. 3H that is similar to the elements shown in FIG. 1A to FIG. 1J may be denoted by the same reference numeral as labelled in FIG. 1A to FIG. 1J. Referring to FIG. 3A and FIG. 3B, the steps illustrated in FIG. 3A and FIG. 3B are similar to the steps illustrated in FIG. 1A and FIG. 1B, so the detailed descriptions thereof are omitted herein. As illustrated in FIG. 3B, the front surface 300a of the bridge structure 300 is located at a level height higher than top surfaces of the conductive pillars 200. For example, top surfaces of the connectors 308 are located at a level height higher than top surfaces of the conductive pillars 200.

Figure 3C:
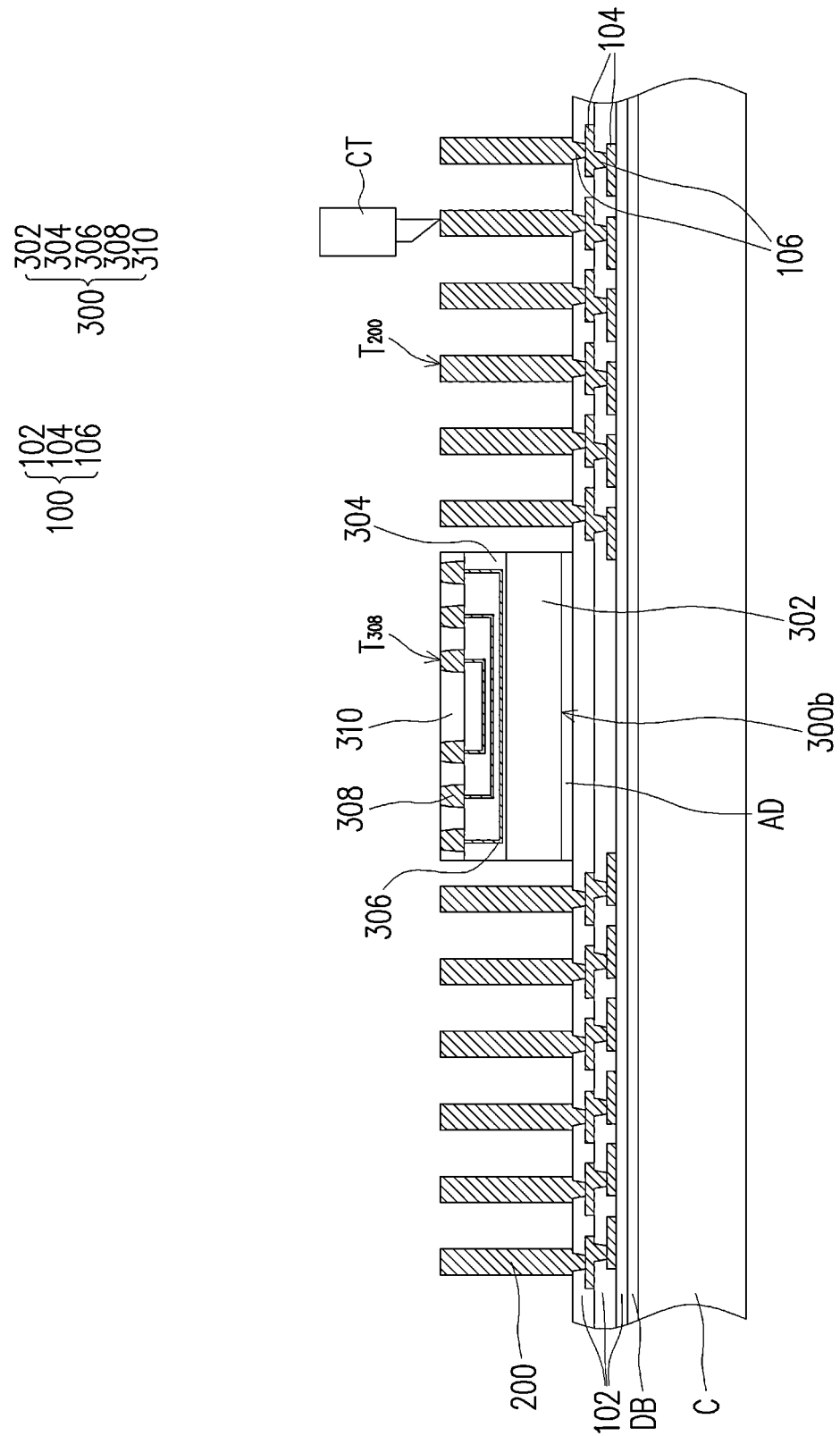

Referring to FIG. 3C, a planarization process is performed on the conductive pillars 200 and the bridge structure 300. In some embodiments, the planarization process may include a fly cutting process. For example, a fly cutting process may be performed on the conductive pillars 200 and the bridge structure 300 through a cutting tool CT such that top surfaces $T_{308}$ of the connectors 308 of the bridge structure 300 are substantially coplanar with top surfaces $T_{200}$ of the conductive pillars 200. In some embodiments, a roughness of the top surfaces $T_{200}$ of the conductive pillars 200 may range from about 0 μm to about 0.05 μm. Similarly, a roughness of the top surfaces $T_{308}$ of the connectors 308 of the bridge structure 300 may also range from about 0 μm to about 0.05 μm. On the other hand, a total thickness variation (TTV) among the conductive pillars 200 is smaller than 3 μm.

Figure 3D:
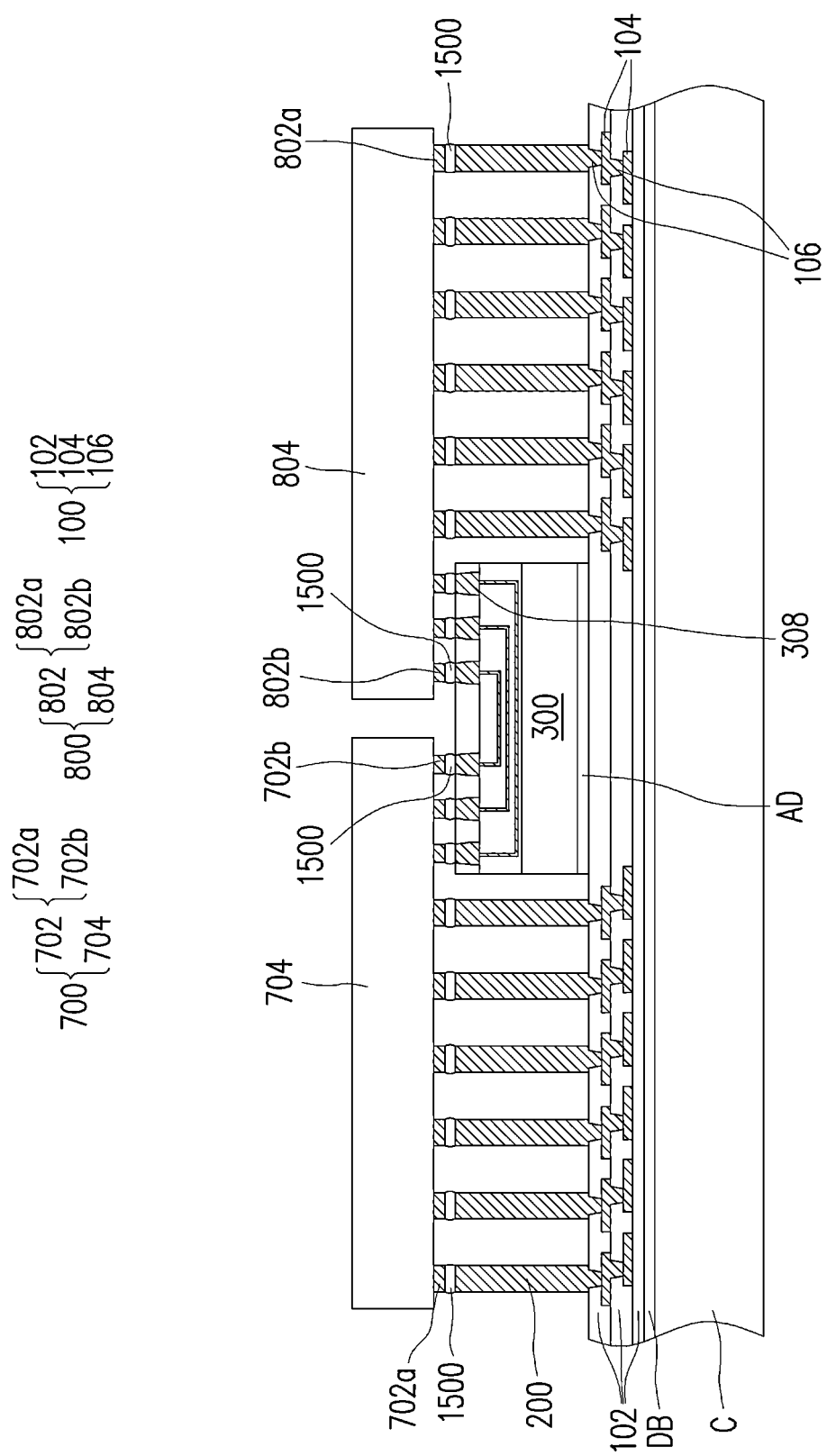

Referring to FIG. 3D, a first die 700 and a second die 800 are attached to the conductive pillars 200 and the connectors 308 of the bridge structure 300. The detailed description of the first die 700 and the second die 800 may be found in the text related to FIG. 1F and will not be repeated herein. In some embodiments, the first die 700 and the second die 800 are attached to the conductive pillars 200 and the bridge structure 300 through flip-chip bonding. For example, the conductive connectors 702 of the first die 700 and the conductive connectors 802 of the second die 800 are respectively connected to the conductive pillars 200 and the connectors 308 of the bridge structure 300 through a plurality of solder joints 1500. In some embodiments, a solder paste (not shown) may be formed on the conductive connectors 702 and the conductive connectors 802. Subsequently, the conductive connectors 702 and the conductive connectors 802 having the solder paste formed thereon is attached to the conductive pillars 200 and the connectors 308. Thereafter, a reflow process is performed to ensure the adhesion between the first die 700, the second die 800, the conductive pillars 200, and the bridge structure 300, thereby forming the solder joints 1500.

As illustrated in FIG. 3D, the locations of the first sub-conductive connectors 702a correspond to the locations of a portion of the conductive pillars 200, and the locations of the second sub-conductive connectors 702b correspond to the locations of a portion of the connectors 308. Similarly, the locations of the first sub-conductive connectors 802a correspond to the locations of another portion of the conductive pillars 200, and the locations of the second sub-conductive connectors 802b correspond to the locations of another portion of the connectors 308. In some embodiments, the solder joints 1500 are formed between the first sub-conductive connectors 702a, 802a and the conductive pillars and between the second sub-conductive connectors 702b, 802b and the connectors 308 of the bridge structure 300. In some embodiments, a diameter/width of the conductive pillars 200 may be substantially equal to a diameter/width of the first sub-conductive connectors 702a, 802a. Similarly, a diameter/width of the connectors 308 of the bridge structure 300 may be substantially equal to a diameter/width of the second sub-conductive connectors 702b, 802b.

Figure 3E:
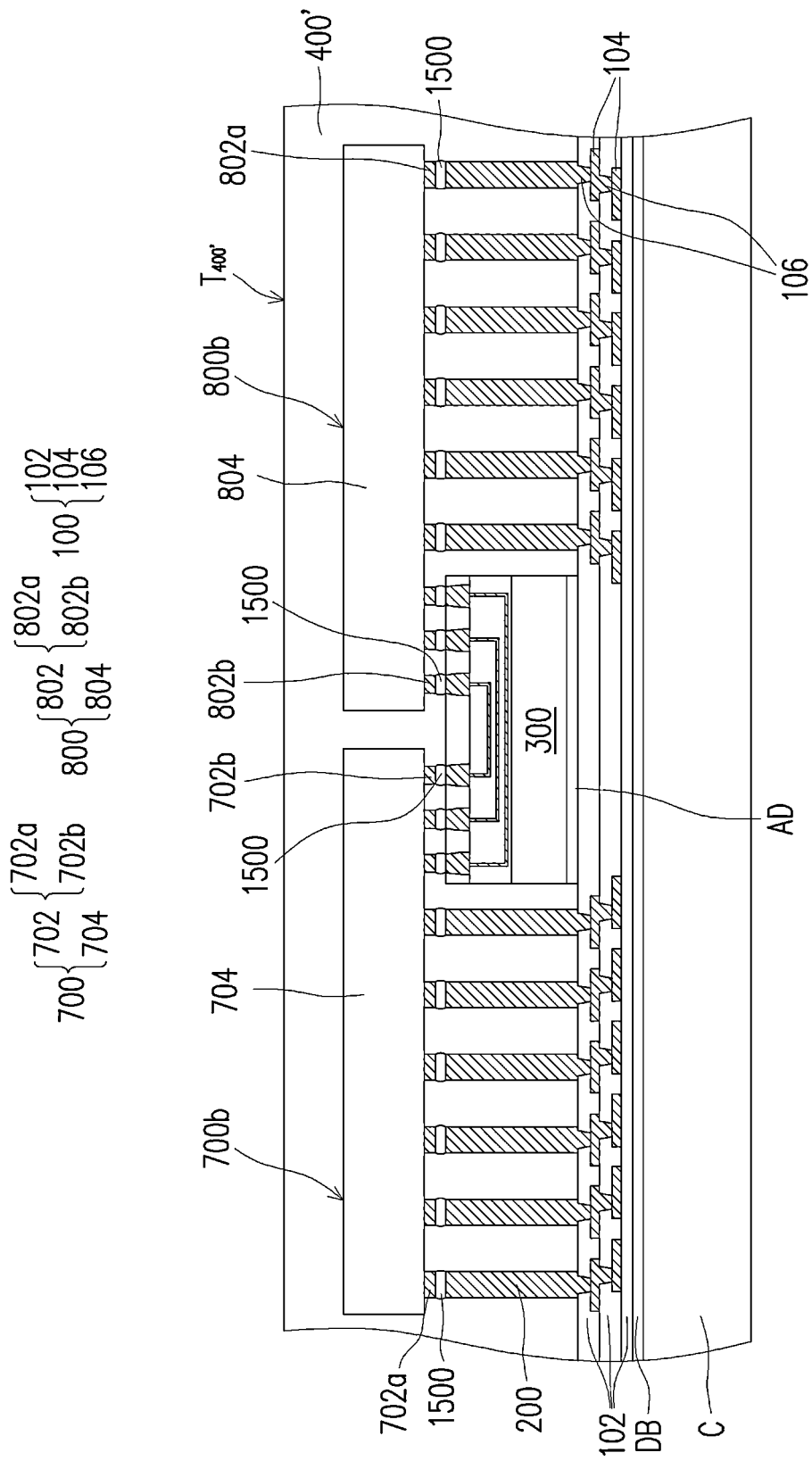

Referring to FIG. 3E, an encapsulation material 400' is formed over the redistribution structure 100 to cover the conductive pillars 200, the adhesive layer AD, the bridge structure 300, the first die 700, and the second die 800. For example, the conductive pillars 200, the adhesive layer AD, the bridge structure 300, the first die 700, and the second die 800 are encapsulated by the encapsulation material 400'. In some embodiments, a top surface $T_{400}$ of the encapsulation material 400' is located at a level height higher than the rear surface 700b of the first die 700 and the rear surface 800b of the second die 800. The detailed description of the encapsulation material 400' may be found in the text related to FIG. 1C and will not be repeated herein. In some embodiments, the encapsulation material 400' fills spacings between two adjacent conductive connectors 702 and spacings between two adjacent conductive connectors 802. In other words, the conductive connectors 702, 802 are directly in contact with the encapsulation material 400'.

Figure 3F:
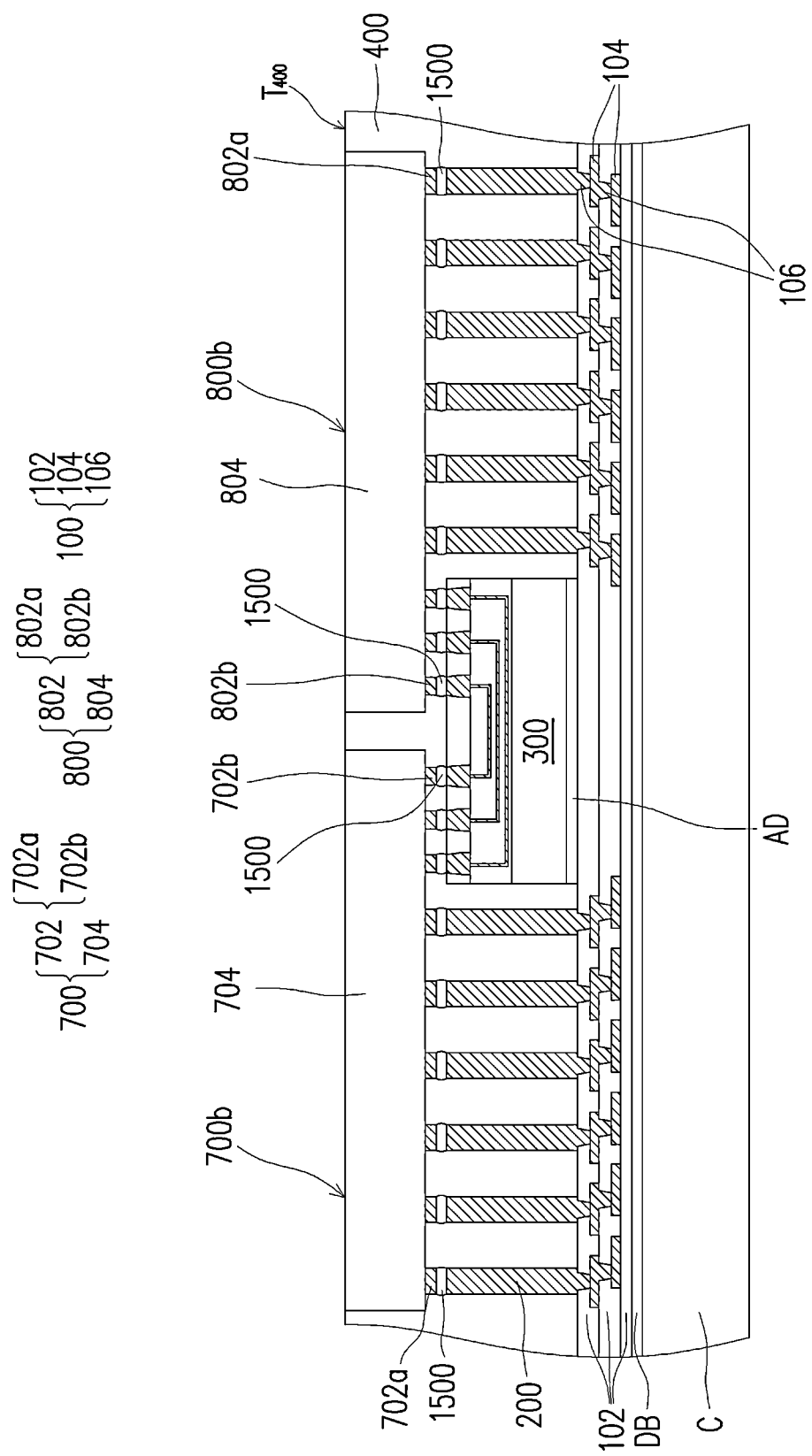

Referring to FIG. 3E and FIG. 3F, the encapsulation material 400' is planarized to form an encapsulant 400. In some embodiments, a thickness of the encapsulation material 400' is reduced to expose the rear surface 700b of the first die 700 and the rear surface 800b of the second die 800. In some embodiments, the planarization process includes a mechanical grinding process and/or a chemical mechanical polishing (CMP) process. However, the disclosure is not limited thereto. In some alternative embodiments, an etching process or a fly cutting process may be adapted to planarize the encapsulation material 400'. It should be noted that in some embodiments, portions of the substrate 704 and portions of the substrate 804 are slightly grinded as well to reduce the overall thickness of the subsequently formed package structure. In other words, the rear surface 700b of the first die 700 and the rear surface 800b of the second die 800 are also grinded. In some embodiments, the rear surface 700b of the first die 700 and the rear surface 800b of the second die 800 are substantially coplanar with a top surface $T_{400}$ of the encapsulant 400. As mentioned above, the encapsulation material 400' fills the spacings between two adjacent conductive connectors 702 and the spacings between two adjacent conductive connectors 802. Therefore, the conductive connectors 702, 802 are directly in contact with the encapsulant 400 and are well protected by the encapsulant 400. The reliability and the durability of the conductive connectors 702, 802 may be ensured through the usage of the auxiliary encapsulant 400 without adapting additional underfill.

It should be noted that the steps of forming the encapsulant 400 presented in FIG. 3E and FIG. 3F merely serve as exemplary illustrations, and the disclosure is not limited thereto. In some alternative embodiments, the encapsulant 400 may be formed by other suitable methods. For example, the encapsulant 400 may be formed by methods similar to the steps presented in FIG. 2A to FIG. 2C.

Figure 3G:
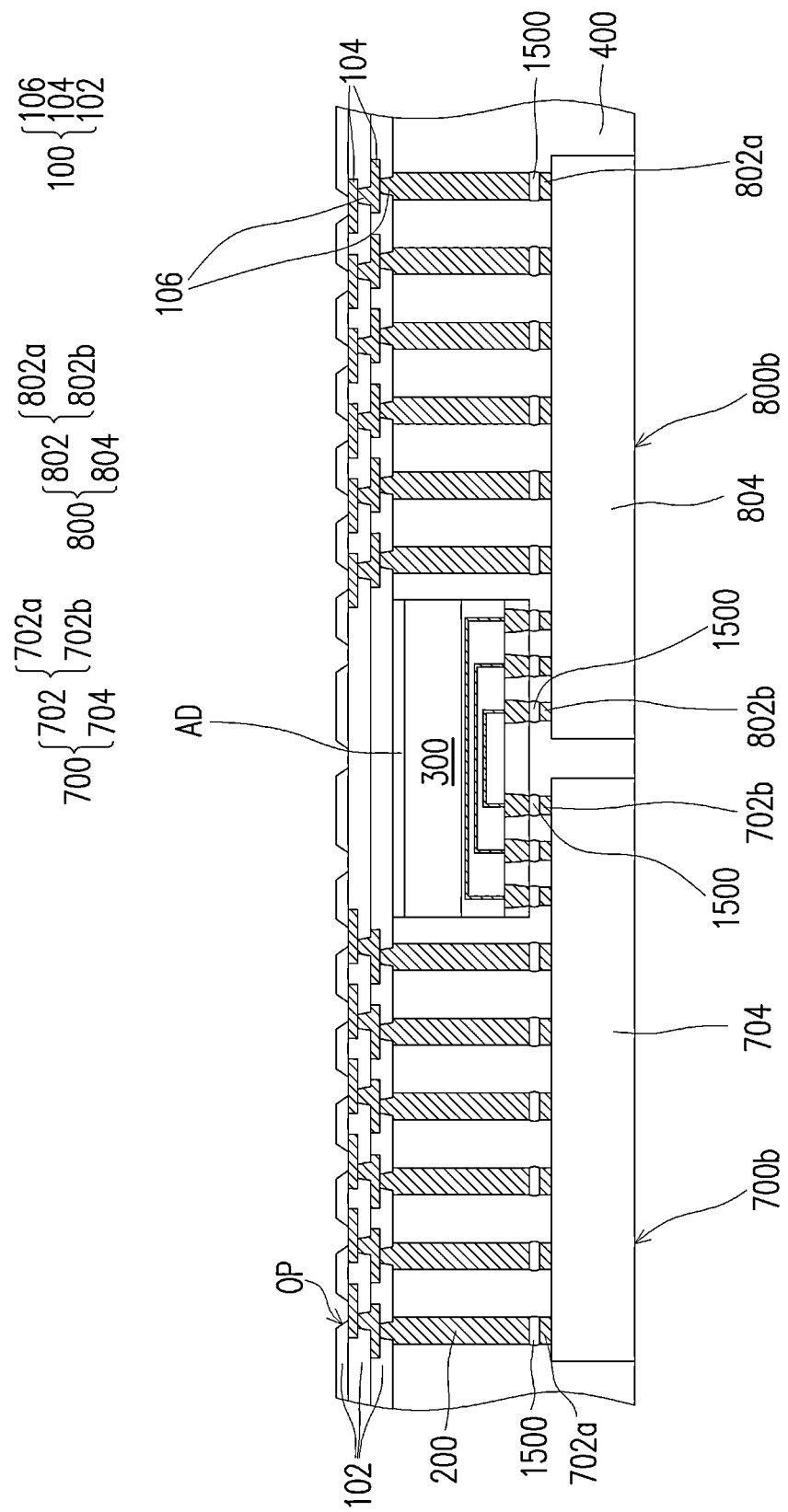

Referring to FIG. 3G, the structure illustrated in FIG. 3F is flipped upside down. The de-bonding layer DB and the carrier C are removed from the redistribution structure 100. The de-bonding layer DB and the carrier C may be removed through methods similar to the steps described in the text related to FIG. 1I, so the detailed descriptions thereof are omitted herein. After the de-bonding layer DB and the carrier C are removed, a plurality of openings OP are formed in the outermost dielectric layer 102 of the redistribution structure 100. In some embodiments, the openings OP are formed by a laser drilling process, a mechanical drilling process, a photolithography process and an etching process, or other suitable processes. As illustrated in FIG. 3G, the openings OP expose the outermost redistribution circuit patterns 104 of the redistribution structure 100.

Figure 3H:
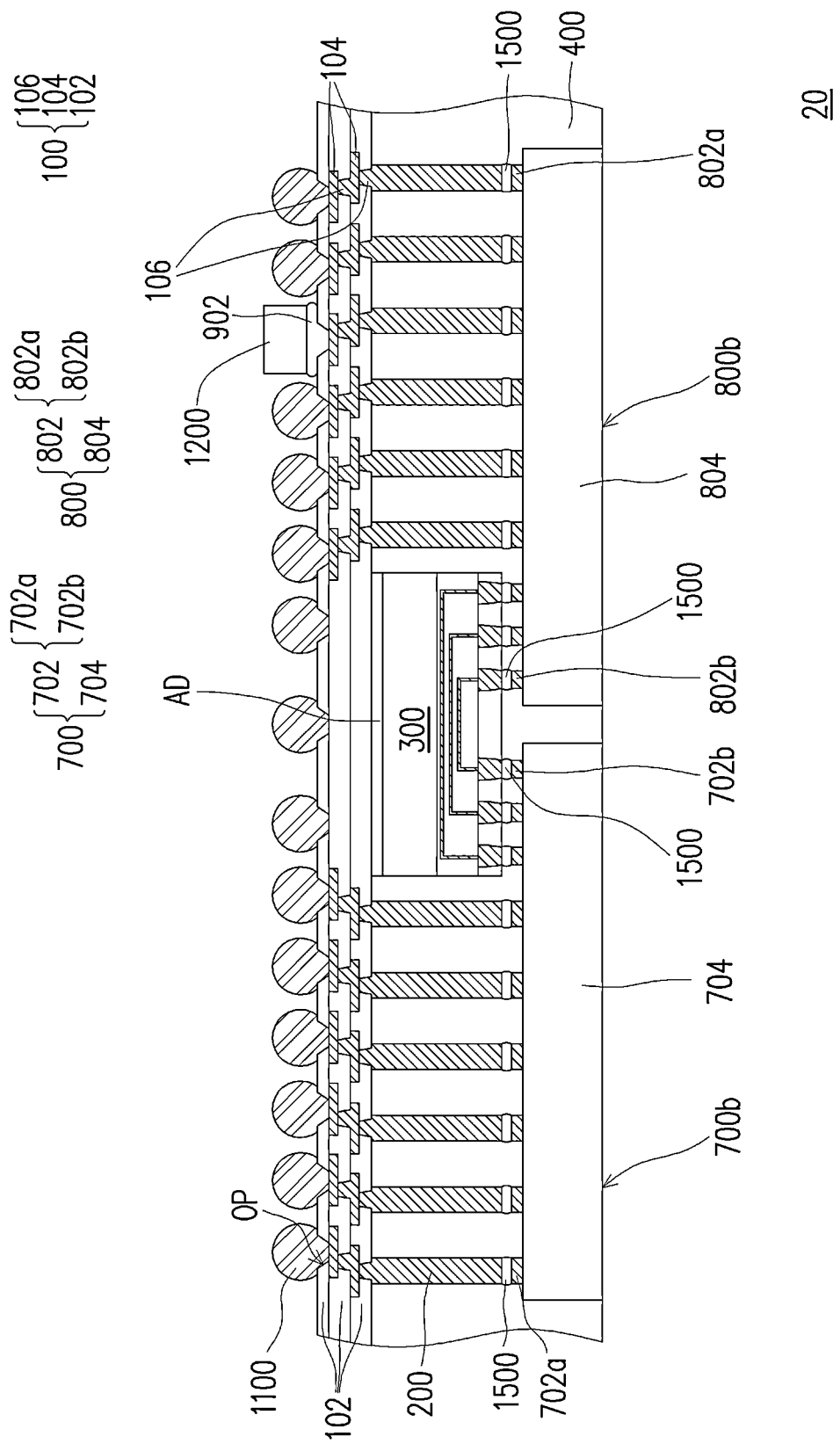

Referring to FIG. 3H, a plurality of conductive terminals 1100 and at least one passive device 1200 are formed on the redistribution structure 100 opposite to the bridge structure 300. The detailed description of the conductive terminals 1100 and the passive device 1200 may be found in the text related to FIG. 1J and will not be repeated herein. In some embodiments, the passive device 1200 are electrically connected to the outermost redistribution circuit patterns 104 of the redistribution structure 100 through a plurality of solder joints 902 disposed therebetween. The solder joints 902 may be similar to the solder joints 900 in FIG. 1F, so the detailed description thereof is omitted herein.

After forming the conductive terminals 1100 and the passive device 1200 on the redistribution structure 100, a singulation process is performed to form a plurality of packages 20. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the package 20 may be referred to as an integrated fan-out (InFO) package. However, the disclosure is not limited thereto. In some alternative embodiments, the package 20 may be other types of packages. As mentioned above, through the usage of the bridge structure 300, additional substrate adapted conventionally may be omitted. Since no additional substrate is being utilized, the warpage of the package during the manufacturing process thereof may be sufficiently controlled through the selection of the encapsulation material 400'. As such, the conventionally adapted mechanical strength enhancer such as lids or rings may be eliminated, and the size of the package 20 may be further reduced.

In accordance with some embodiments of the disclosure, a package includes a first redistribution structure, a bridge structure, an adhesive layer, a plurality of conductive pillars, an encapsulant, a first die, and a second die. The bridge structure is disposed on the first redistribution structure. The adhesive layer is disposed between the bridge structure and the first redistribution structure. The conductive pillars surround the bridge structure. A height of the conductive pillars is substantially equal to a sum of a height of the adhesive layer and a height of the bridge structure. The encapsulant encapsulates the bridge structure, the adhesive layer, and the conductive pillars. The first die and the second die are disposed over the bridge structure. The first die is electrically connected to the second die through the bridge structure. The first die and the second die are electrically connected to the first redistribution structure through the conductive pillars.

In accordance with some embodiments of the disclosure, a method of manufacturing a package includes at least the following steps. A carrier is provided. A first redistribution structure is formed on the carrier. A plurality of conductive pillars is formed on the first redistribution structure and a bridge structure is provided on the first redistribution structure. The conductive pillars surround the bridge structure. A first encapsulation material is formed on the first redistribution structure to cover the conductive pillars and the bridge structure. The first encapsulation material is planarized to form an encapsulant. The encapsulant exposes the conductive pillars and the bridge structure. A second redistribution structure is formed over the conductive pillars, the bridge structure, and the encapsulant. A first die and a second die are disposed on the second redistribution structure. The first die and the second die are electrically connected to the second redistribution structure. The first die and the second die are encapsulated by an auxiliary encapsulant. The carrier is removed.

In accordance with some alternative embodiments of the disclosure, a method of manufacturing a package includes at least the following steps. A carrier is provided. A first redistribution structure is formed on the carrier. A plurality of conductive pillars is formed on the first redistribution structure and a bridge structure is provided on the first redistribution structure. The bridge structure includes a plurality of connectors. The conductive pillars and the bridge structure are planarized such that top surfaces of the conductive pillars and top surfaces of the connectors are substantially coplanar. A first die and a second die are attached to the conductive pillars and the connectors through a plurality of solder joints disposed therebetween. The conductive pillars, the bridge structure, the first die, and the second die are encapsulated by an encapsulant. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a redistribution structure having a first surface and a second surface opposite to the first surface;
    a bridge die, comprising:
        a substrate;
        a dielectric layer disposed on the substrate; and
        routing patterns embedded in the dielectric layer;
    conductive pillars disposed on the first surface of the redistribution structure, wherein the conductive pillars are aside the bridge die;
    connectors sandwiched between the bridge die and the first surface of the redistribution structure;
    a first die disposed over the second surface of the redistribution structure;
    first solder joints located between the first die and the second surface of the redistribution structure, wherein a vertical projection of the bridge die onto the first die is overlapped with the first solder joints; and
    second solder joints located between the first die and the second surface of the redistribution structure, wherein the vertical projection of the bridge die onto the first die is laterally offset from the second solder joints.

2. The package according to claim 1, further comprising:
    a passivation layer wrapping around the connectors; and
    an encapsulant laterally encapsulating the bridge die and the conductive pillars, wherein the dielectric layer separates the routing patterns from the encapsulant, and the passivation layer separates the connectors from the encapsulant.

3. The package according to claim 2, wherein the material of the dielectric layer comprises polyimide, epoxy resin, acrylic resin, phenolic resin, benzocyclobutene (BCB), or polybenzoxazole (PBO), and the material of the passivation layer comprises silicon oxide, silicon nitride, or silicon oxy-nitride.

4. The package according to claim 1, wherein a diameter/width of each first solder joint is smaller than a diameter/width of each second solder joint.

5. The package according to claim 1, further comprising:
    a second die disposed over the second surface of the redistribution structure;
    third solder joints located between the second die and the second surface of the redistribution structure, wherein a vertical projection of the bridge die onto the second die is overlapped with the third solder joints; and
    fourth solder joints located between the second die and the second surface of the redistribution structure, wherein the vertical projection of the bridge die onto the second die is laterally offset from the fourth solder joints.

6. The package according to claim 5, further comprising an auxiliary encapsulant encapsulating the first die and the second die.

7. The package according to claim 6, wherein the auxiliary encapsulant comprises a recess located between the first die and the second die.

8. A method of manufacturing a package, comprising:
    providing a bridge die having a top side, a bottom side, and lateral sides, wherein the bridge die comprises a substrate, a dielectric layer disposed on the substrate, and routing patterns embedded in the dielectric layer;
    forming connectors on the bottom side of the bridge die;
    forming conductive pillars aside the bridge die at a position that is laterally offset from the bridge die;
    providing a redistribution structure comprising a first surface, a second surface opposite to the first surface, and lateral surfaces connecting the first surface and the second surface;
    attaching the bottom side of the bridge die and the to the first surface of the redistribution structure through the connectors, such that the connectors are sandwiched between the bridge die and the first surface of the redistribution structure, the bridge die is electrically coupled to the redistribution structure through at least the connectors, and the conductive pillars are disposed on the first surface of the redistribution structure;

providing a first die comprising a top side, a bottom side, and lateral sides; and coupling the second surface of the redistribution structure to the top side of the first die through first solder joins and second solder joints, wherein the first die is electrically coupled to the bridge die through the first solder joints located between the first die and the second surface of the redistribution structure, the first die is electrically coupled to the conductive pillars through the second solder joints located between the first die and the second surface of the redistribution structure, a vertical projection of the bridge die onto the first die is overlapped with the first solder joints, and the vertical projection of the bridge die onto the first die is laterally offset from the second solder joints.

9. The method according to claim 8, further comprising forming an encapsulant to laterally encapsulate the bridge die and the conductive pillars, wherein the routing patterns of the bridge die and the connectors are completely spaced apart from the encapsulant.

10. The method according to claim 8, further comprising laterally encapsulating the first die by an auxiliary encapsulant.

11. The method according to claim 10, wherein encapsulating the first die comprises:

forming an encapsulation material on the second surface of the redistribution structure to cover the first die; and reducing a thickness of the encapsulation material to expose the first die.

12. The method according to claim 10, wherein encapsulating the first die comprises:

providing a mold chase having a release film attached thereon over the first die;

pressing the mold chase and the release film against the first die such that the release film is attached to the first die;

filling an encapsulation material into a gap between the release film and the redistribution structure;

curing the encapsulation material to form the auxiliary encapsulant; and removing the mold chase and the release film.

13. A package comprising:

a redistribution structure comprising a top side, a bottom side, and lateral sides;

a bridge die having a top side, a bottom side, and lateral sides, wherein the bridge die comprises:

a substrate;

a dielectric layer disposed on the substrate; and routing patterns embedded in the dielectric layer;

conductive pillars coupled to the top side of the redistribution structure at a position that is laterally offset from the bridge die;

connectors coupled to the bottom side of the bridge die and to the top side of the redistribution structure, such that the bridge die is electrically coupled to the redistribution structure through at least the connectors;

a first die comprising a top side, a bottom side, and lateral sides;

first solder joints located between the first die and the bottom side of the redistribution structure, such that the first die is electrically coupled to the bridge die; and second solder joints located between the first die and the bottom side of the redistribution structure, such that the first die is electrically coupled to the conductive pillars.

14. The package according to claim 13, further comprising an encapsulant encapsulating the bridge die and the conductive pillars, wherein the routing patterns of the bridge die and the connectors are completely spaced apart from the encapsulant.

15. The package according to claim 14, wherein the encapsulant is in physical contact with lateral sides of the bridge die.

16. The package according to claim 13, wherein the substrate comprises a semiconductor substrate, a glass substrate, or a polymeric substrate.

17. The package according to claim 13, wherein a diameter/width of each first solder joint is smaller than a diameter/width of each second solder joint.

18. The package according to claim 13, further comprising:

a second die comprising a top side, a bottom side, and lateral sides;

third solder joints located between the second die and the bottom side of the redistribution structure, such that the second die is electrically coupled to the bridge die; and fourth solder joints located between the second die and the bottom side of the redistribution structure, such that the second die is electrically coupled to the conductive pillars.

19. The package according to claim 18, further comprising an auxiliary encapsulant encapsulating the first die and the second die.

20. The package according to claim 19, wherein the auxiliary encapsulant comprises a recess located between the first die and the second die.

* * * * *